United States Patent
Wu et al.

(10) Patent No.: US 9,324,402 B2
(45) Date of Patent: *Apr. 26, 2016

(54) HIGH DENSITY LOW POWER GSHE-STT MRAM

(71) Applicant: QUALCOMM Incorporated, San Diego, CA (US)

(72) Inventors: Wenqing Wu, San Diego, CA (US); Raghu Sagar Madala, San Diego, CA (US); Kendrick Hoy Leong Yuen, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/479,832

(22) Filed: Sep. 8, 2014

(65) Prior Publication Data

US 2015/0213866 A1   Jul. 30, 2015

Related U.S. Application Data

(63) Continuation of application No. 14/451,510, filed on Aug. 5, 2014, now Pat. No. 9,230,627.

(60) Provisional application No. 61/932,767, filed on Jan. 28, 2014.

(51) Int. Cl.
| G11C 11/16 | (2006.01) |
| H01L 43/14 | (2006.01) |
| G11C 11/18 | (2006.01) |

(52) U.S. Cl.
CPC .............. *G11C 11/161* (2013.01); *G11C 11/16* (2013.01); *G11C 11/1659* (2013.01); *G11C 11/18* (2013.01); *H01L 43/14* (2013.01)

(58) Field of Classification Search
CPC ............................ G11C 11/16; G11C 11/1673
USPC ................................................. 365/158, 173
See application file for complete search history.

(56) References Cited

U.S. PATENT DOCUMENTS

| 5,936,880 | A | * | 8/1999 | Payne ........................... | 365/148 |
| 6,473,275 | B1 |   | 10/2002 | Gill | |
| 6,711,053 | B1 | * | 3/2004 | Tang ............................ | 365/158 |
| 6,906,511 | B2 |   | 6/2005 | Chaparala | |
| 6,985,383 | B2 | * | 1/2006 | Tang et al. .................... | 365/171 |

(Continued)

FOREIGN PATENT DOCUMENTS

| WO | 2013025994 A2 | 2/2013 |
| WO | 2014025838 A1 | 2/2014 |

OTHER PUBLICATIONS

Liu L., et al., "Spintronics Research at Cornell (with some questions for you)," 2013, pp. 1-42.

(Continued)

*Primary Examiner* — Michael Tran
(74) *Attorney, Agent, or Firm* — Muncy, Geissler, Olds & Lowe, P.C.

(57) ABSTRACT

Systems and methods are directed to a memory element comprising a hybrid giant spin Hall effect (GSHE)-spin transfer torque (STT) magnetoresistive random access memory (MRAM) element, which includes a GSHE strip formed between a first terminal (A) and a second terminal (B), and a magnetic tunnel junction (MTJ), with a free layer of the MTJ interfacing the GSHE strip, and a fixed layer of the MTJ coupled to a third terminal (C). The orientation of the easy axis of the free layer is perpendicular to the magnetization created by electrons traversing the GSHE strip between the first terminal and the second terminal, such that the free layer of the MTJ is configured to switch based on a first charge current injected from/to the first terminal to/from the second terminal and a second charge current injected/extracted through the third terminal into/out of the MTJ via the third terminal (C).

25 Claims, 22 Drawing Sheets

Conventional implementation I - 1T1J SHE-MRAM

(56) References Cited

U.S. PATENT DOCUMENTS

| | | |
|---|---|---|
| 7,009,874 B2 | 3/2006 | Deak |
| 7,839,675 B2 | 11/2010 | Koo et al. |
| 2010/0271866 A1 | 10/2010 | Sakimura et al. |
| 2014/0008742 A1 | 1/2014 | Chen et al. |
| 2014/0056061 A1 | 2/2014 | Khvalkovskiy et al. |
| 2014/0269035 A1 | 9/2014 | Manipatruni et al. |
| 2015/0213865 A1 | 7/2015 | Wu et al. |

OTHER PUBLICATIONS

Pai C-F., et al., "Spin transfer torque devices utilizing the giant spin Hall effect of tungsten," Applied Physics Letters, 2012, vol. 101 (12), pp. 1-18.

Gregory D. P. et al., "Hybrid CMOS/magnetic Process Design Kit and SOT-based Non-volatile Standard Cell Architectures", 2014 19th Asia and South Pacific Design Automation Conference (ASP-DAC), IEEE, Jan. 20, 2014, pp. 692-699, XP032570102, DOI: 10.1109/ASPDAC.2014.6742971.

International Search Report and Written Opinion—PCT/US2015/011895—ISA/EPO—Apr. 22, 2015.

Pai C-F., et al., "Spin Transfer Torque Devices Utilizing the Giant Spin Hall Effect of Tungsten", Applied Physics Letters, American Institute of Physics, US, vol. 101, No. 12, Sep. 17, 2012, pp. 122404-122404, XP012164618, ISSN: 0003-6951, DOI: 10.1063/1.4753947 [retrieved on Sep. 18, 2012].

\* cited by examiner

PARALLEL MAGNETIZATION
LOW RESISTANCE
STATE "0"

ANTIPARALLEL MAGNETIZATION
HIGH RESISTANCE
STATE "1"

CONVENTIONAL STT-MRAM

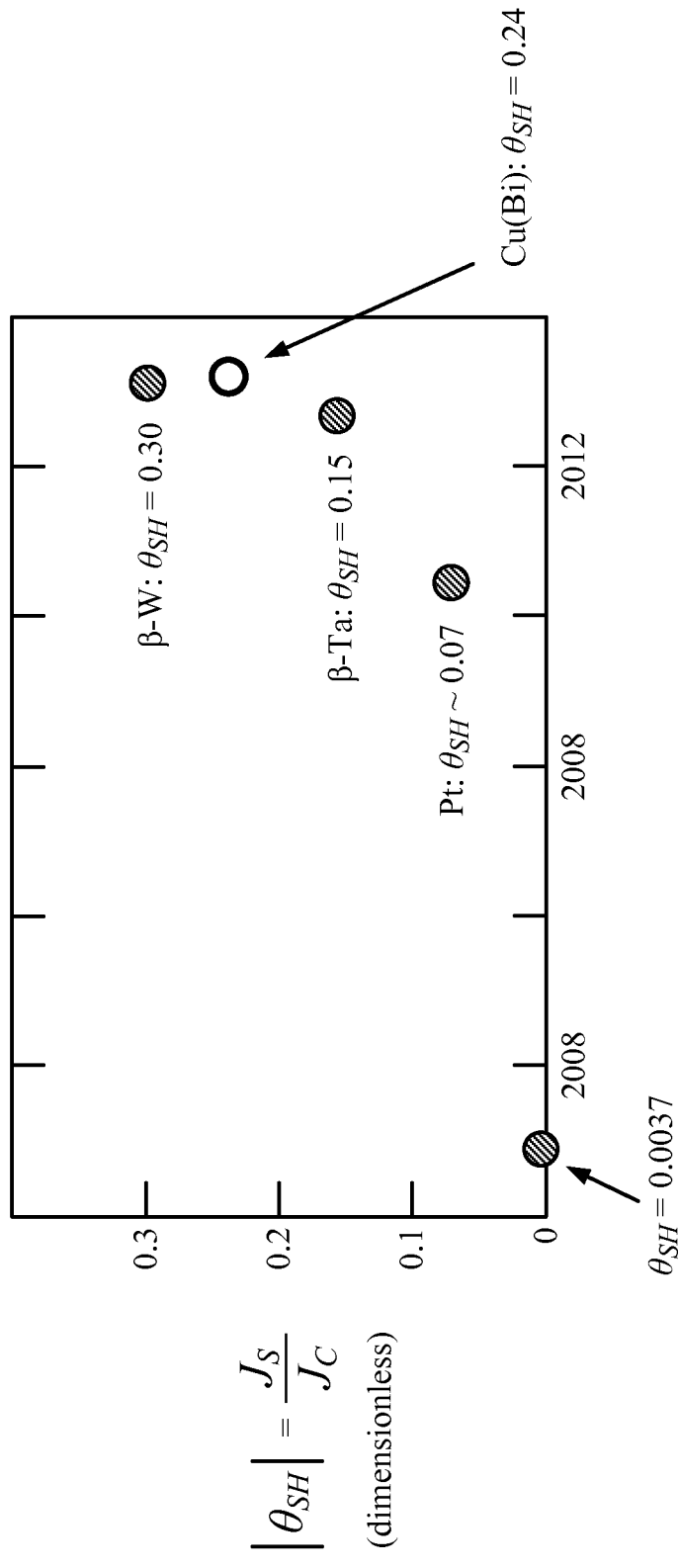

Conventional implementation 1 - 1T1J SHE-MRAM

Conventional implementation 2 - 1T1J SHE-MRAM

Conventional implementation 3 - 1T1J SHE-MRAM

Conventional implementation 4 - 2T1J SHE-MRAM

Conventional implementation 5 - 2T1J SHE-MRAM

Conventional implementation 6 - 2T1J SHE-MRAM

- Potential Energy
  - $\varepsilon = -0.5 H_K M_s \cos^2 \theta - H_x M_s \cos(\pi - \theta) - H_y M_s \cos(\pi/2 - \theta)$
- Critical Switching Conditioning
  1) $d\varepsilon/d\theta = 0$
  2) $d^2\varepsilon/d\theta^2 = 0$
- Solving these equations to reach switching threshold requirement:
  - ❖ $H_x^{2/3} + H_y^{2/3} = H_K^{2/3}$
  - ❖ a.k.a. Stoner-Wohlfarth Switching Astroid Stoner-Wohlfarth Switching Model Embodiment 1 – high density Embodiment 2 - trade-off between high density and low leakage Embodiment 3 - low leakage Embodiment 4 – improved sensing margin Embodiment 5 – high speed Embodiment 6 – low leakage and high sensing margin

HIGH DENSITY LOW POWER GSHE-STT MRAM

CLAIM OF PRIORITY UNDER 35 U.S.C. §119

The present application for patent claims the benefit of Provisional Patent Application No. 61/932,767 entitled "HIGH DENSITY LOW POWER GSHE-STT MRAM" filed Jan. 28, 2014, pending, and assigned to the assignee hereof and hereby expressly incorporated herein by reference in its entirety.

CLAIM OF PRIORITY UNDER 35 U.S.C. §120

The present application for patent is a Continuation of patent application Ser. No. 14/451,510 entitled "HIGH DENSITY LOW POWER GSHE-STT MRAM" filed Aug. 5, 2014, pending, and assigned to the assignee hereof and hereby expressly incorporated herein by reference in its entirety.

FIELD OF DISCLOSURE

Disclosed embodiments are directed to high density low power hybrid giant spin Hall effect (GSHE)-spin transfer torque (STT) magnetoresistive random access memory (MRAM) structures.

BACKGROUND

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic moment, separated by an insulating (tunnel barrier) layer 120. One of the two layers (e.g., fixed layer 110), is set to a particular polarity. The other layer's (e.g., free layer 130) polarity 132 is free to change to match that of an external magnetic field that can be applied. A change in the polarity 132 of the free layer 130 will change the resistance of the MTJ storage element 100. For example, when the magnetization polarities are aligned, FIG. 1A, a low resistance state exists (parallel "P" magnetization low resistance state "0"). When the magnetization polarities are not aligned, FIG. 1B, then a high resistance state exists (anti-parallel "AP" magnetization high resistance state "1"). The illustration of MTJ 100 has been simplified and those skilled in the art will appreciate that each layer illustrated may comprise one or more layers of materials, as is known in the art. For example, one or more additional layers made of anti-ferromagnetic materials may be added on top of free layer 130 in order to improve the speed and efficiency of switching of the free layer.

Referring to FIG. 2, a memory cell 200 of a conventional MRAM is illustrated for a read operation. The cell 200 includes a transistor 210, bit line 220, digit or source line 230 and word line 240. The cell 200 can be read by measuring the electrical resistance of the MTJ 100. For example, a particular MTJ 100 can be selected by activating an associated transistor 210 (transistor on), which can switch current from a bit line 220 through the MTJ 100. Due to the tunnel magnetoresistive effect, the electrical resistance of the MTJ 100 changes based on the orientation of the magnetization polarities in the two magnetic layers (e.g., 110, 130), as discussed above. The resistance inside any particular MTJ 100 can be determined from the current, resulting from the magnetization polarity of the free layer. Conventionally, if the fixed layer 110 and free layer 130 have the same magnetization polarity, the resistance is low and a "0" is read. If the fixed layer 110 and free layer 130 have opposite magnetization polarity, the resistance is higher and a "1" is read.

Unlike conventional MRAM, Spin Transfer Torque Magnetoresistive Random Access Memory (STT-MRAM) is known in the art, where an STT-MRAM bit cell uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the magnetization polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. Transistor 310 is turned on for both read operations and write operations, in order to allow current to flow through MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, source line 340, sense amplifier 350, read/write circuitry 360 and bit line reference 370 are illustrated. As discussed above, during a read operation, a read current is generated, which flows between the bit line 320 and source line 340 through MTJ 305. When the current is permitted to flow via transistor 310, the resistance (logic state) of the MTJ 305 can be sensed based on the voltage differential between the bit line 320 and source line 340, which is compared to a reference 370 and then amplified by sense amplifier 350. Those skilled in the art will appreciate the operation and construction of the memory cell 301 is known in the art.

With reference now to FIG. 4, a memory array comprising STT-MRAM cells, such as, cell 300 of FIG. 3A, is illustrated. As shown herein, each bit cell has 3 terminals, viz., a word-line select terminal (WL[*]), a bit-line terminal (BL[*]), and a source-line terminal (SL[*]). This cell structure with a single access transistor such as transistor 310 of FIG. 3B is referred to as a 1T1J (one-transistor-one-MTJ) implementation, which is known to consume approximately one-half to one-fourth of the area consumed by conventional SRAM cells. As shown, the transistors are used to switch on or off the connection between the MTJ and SL[i], where the transistors are controlled by the word-line select terminals respectively.

In more detail, during write operations, the MTJs of the STT-MRAM bit cells are configured as programmable resistors of value of ~2.5-5K ohms. For writing a particular bit cell, the corresponding selected word line is asserted and all unselected word lines are de-asserted. Appropriate voltages for the value to be written are set on BL[0,1,2 . . . ] and SL[0,1,2 . . . ]. An overdrive voltage may be applied on the transistor gate to avoid the gate-drain voltage of the transistor ($V_{gd}$) to drop to zero, as write operations are bi-polar (i.e., current flows in one direction for writing logic 0, and flows in the opposite direction for writing logic 1). Further, the write operations on STT-MRAM bit cells typically require a relatively large current (~150 uA) due to the STT spin polarized current described previously.

In the case of read operations on a bit cell [i] for example, the corresponding selected word line is asserted and all unselected word lines are de-asserted. Both corresponding BL[i] and SL[i] are connected to a sensing circuit [i] (e.g., sense amplifier 350 of FIG. 3B), and the current flow is compared with the reference (e.g., reference 370 of FIG. 3B). If the current is greater than the reference, then logic 0 is sensed, otherwise logic 1 is sensed. For read operations, there is no need for gate overdrive voltage, as read operations are unipolar.

While STT-MRAM technology offers significant improvements over conventional SRAM technology for non-volatile memory cells, for example, in terms of size, speed, cost, area, etc., advances in the area of magnetic cells have been made, which allow for further improvements in these regards. For example, one such advancement is observed in the case of magnetic cells which utilize a so-called spin Hall effect (SHE).

With reference to FIG. 5A, SHE is demonstrated in conductor 500. Electrons 509 passing through conductor 500 in the direction indicated, get polarized on the surfaces 502, 504, 506, and 508 along the directions indicated by arrows 501, 503, 505, and 507 respectively due to spin-orbit coupling. A spin Hall ratio is defined as $$\theta_{SH} = \frac{J_S/(\hbar h/2)}{J_C/e}.$$

While SHE can be used to induce magnetic polarity along the directions 501, 503, 505, and 507, the effect can be improved by using special material (such as beta-tungsten) with appropriate thickness (such as thickness of just a few nanometers) for conductor 500, for example, as described in Pai et al. published as "Spin transfer torque devices utilizing the giant spin Hall effect of tungsten," Applied Physics Letters, §101, 122404, 2012 (hereinafter, the Pai reference). In more detail FIG. 5B illustrates conductor 500 with length (L), thickness (t) and width (W), wherein, with reference to Pai, an improvement $\theta_{SH}$ is shown in orders of magnitude, up to ~0.33 times. This leads to a so-called giant spin Hall effect (GHSE).

The spin current generation efficiency is provided by the following equation:

$$\frac{I_S}{I_C} = \frac{J_S A}{J_C a} = \theta_{SH} \frac{A}{a} = \theta_{SH} \frac{L}{t},$$

where "$I_S$" is the spin current a "$I_C$" is the charge current. The spin current generation efficiency $I_S/I_C$ can be further boosted by making appropriate changes to dimensions of conductor 500. For example, for a value of $\theta_{SH}$=0.30, L=50-100 nm, and t=2 nm, it is seen that the ratio $I_S/I_C$ can be as high as 7.5-15. This spin current generation efficiency in the order of ~7.5-15, can be typical, considering that the ratio of L/t is ~25-50, is typical for cases where the thickness "t" is only a few nanometers whereas the length "L" is in the order of tens of nanometers. In comparison, the spin current generation efficiency from STT polarization is merely ~0.6.

Further, the $\theta_{SH}$ has improved over three orders of magnitude (~1000×) to ~0.3 based on the past few years' advances in SHE material research as shown in FIG. 5C (derived from Spintronics Research at Cornell University by Liu et al.), particularly for conductor materials such as beta-tungsten, beta-tantalum, and platinum, etc. These improvements relate to reasons why GSHE is considered to be "giant" in comparison to previously demonstrated SHE. The GSHE provides an efficient method to convert electric current based on electrons 509 into spin current, which can be used for providing switching current to MTJ cells.

Moreover, in comparison to STT-MRAMs, with the same resistance of the MTJ, the programming power using the GHSE effect can be approximately 50-200 times lower, which means that it is easier to write MTJs based on GHSE, which in turn, translates into smaller memory cells and high memory density. Moreover, a cap for the write current ($I_{Write}$) observed for STT-MRAM (in order to avoid breakdown of the tunnel or barrier layer) is eliminated using GHSE. As shown, a magnetic element 510 placed on top of conductor 500 can get polarized in the direction indicated by arrow 501. As previously described, the ratio $I_S/I_C$ can be varied by adjusting area A (=L*w) or area a (=t*w), or in other words, by adjusting the ratio, L/t. If magnetic material 510 is placed in the orientation shown, where width W is wider than thickness t, the direction 501 influences the polarization of magnetic material 510. More specifically, when magnetic material 510, configured as a free layer, is placed on top of conductor 500, configured as a spin-orbital coupling layer, the spin orientation 501 from spin Hall effect can influence the magnetization of the free layer magnetic material 510.

With reference now to FIG. 6A, a side view of a conventional memory element 600 that is switched (programmed, or written) by SHE (or more specifically GSHE) is illustrated. A SHE/GSHE strip comprising conductor 500 (referred to simply as a GSHE strip 500 in this case), which may be formed from strong spin-orbit coupling material, such as β-W, β-Ta, or Pt is formed between terminals A and B. Terminals A and B may be formed from metals such as copper. An MTJ 601 is placed above the GSHE strip 500, with a free layer of MTJ 601 adjacent to and in contact with GSHE 500. Write current $I_W$ is passed through the GSHE strip in the direction indicated between A and B. Based on the induced spin polarization, the free layer of MTJ 601 can be switched. This provides a much more efficient way of programming MTJ 601 than in the STT-MRAM cell structure 301 illustrated in FIG. 3B. Additionally, in memory element 600, optional layers Ru, and CoFe, and an anti-ferromagnetic layer (AFM), and/or a synthetic antiferromagnetic layer (SAF) along with a top electrode are also depicted as formed on MTJ 601. MTJ 601 is read based on sensing the read current $I_{read}$, as will be further explained in following sections.

With reference to FIG. 6B, a top view of MTJ 601 switched by a conventional SHE/GSHE arrangement of FIG. 6A is shown. The direction 602 is perpendicular to the write current from/to terminal A to/from terminal B, and is referred to as the easy axis of MTJ 601. The free layer of MTJ 601 resides at a minimal magneto-static energy region along easy axis 602. In more detail, easy axis orientation is a property of the free layer based on the shape of the free layer. The free layer will always be magnetized along the easy axis when external magnetization force is removed. In conventional SHE switched MTJ, the SHE write current is orthogonal to the easy axis orientation such that the SHE induced spin orientation is in line with easy axis orientation. Thus, easy axis 602 is considered to be oriented along the x direction in FIG. 6B, and is transverse to the direction of write current $I_W$. On the other hand, hard axis 604 of MTJ 601, which is perpendicular to easy axis 602, is formed along the y direction. The free layer of MTJ 601 interfaces GSHE strip 500 and easy axis 602 is in line with or parallel to the corresponding GSHE induced spin orientation. In other words, the orientation of easy axis 602 of the free layer of MTJ 601 is parallel to the magnetization axis created by electrons traversing GSHE strip 500 between the two terminals A and B. As explained previously, the MTJ is in a low resistance state (P state) if the magnetization of the free layer is aligned (parallel) to the magnetization of the fixed layer; and the MTJ is in a high resistance state (AP state) if the magnetization of the free layer is anti-aligned (anti-parallel) to magnetization of the fixed layer.

With reference to FIG. 6C, an equivalent circuit of conventional SHE/GSHE switched MTJ element 600 is depicted, along with the symbol for the device. Under operational conditions, when the current between terminals A and B is no less than a threshold (~20 uA), the MTJ switches to state '0' (low MTJ resistance) if current flows from A to B; and to state '1' (high MTJ resistance) if the current flows in the opposite direction, from B to A. When the current between A and B is less than the threshold (~20 uA), the MTJ retains its previous state (either '0' or '1').

While the above-described conventional SHE/GSHE switched MTJ element 600 exhibits vast improvements over known STT-switched MTJs in STT-MRAM structures, known approaches to utilizing the conventional SHE/GSHE switched MTJ elements suffer various limitations, which will be discussed in detail below. According to the implementations and parameters, the conventional SHE/GSHE switched MTJ elements may be characterized as SHE-switched or GSHE-switched MTJs. In the discussion of these conventional structures, the conventional SHE/GSHE switched MTJ elements (e.g., element 600) have been assumed to be memory elements for SHE-MRAMs, for the sake of generality.

Conventional Implementation 1—1T1J SHE-MRAM

In FIG. 7, a first conventional implementation related to a memory array comprising SHE-MRAM memory cells comprising 1T1J structures (i.e., one access transistor per every memory element comprising an MTJ) is depicted. Each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In each memory cell, the connection between the Write Terminal and WBL[i] is switched on/off via the corresponding access transistor controlled by the Word-line Select Terminal.

During a write operation on a particular bit cell (701) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. For the sake of explanation in the entirety of this discussion (unless indicated otherwise), zero resistance is assumed for the current paths where the access transistors are switched on, and an infinite resistance is assumed for the current paths where the access transistors are switched off. Further, for different kinds of paths which may arise in this disclosure, numerical references have been added, which will be explained below in each pertinent section. Accordingly, in FIG. 7, an intended functional current path has write resistance $R_{wr}$ for the write to bit cell 701, where the intended functional current path is shown with the reference numeral "(1)". During a write operation on bit cell 701, unintended current paths result for cells 701 and 702, which are indicated with the reference numeral "(2)," each with resistance twice the read resistance $R_{rd}$ along with $R_{wr}$ (i.e., $2R_{rd}+R_{wr}$). In this case, it is noted that even though these unintended paths do not cause write functionality to fail for the write operation, since $R_{rd}$ is much bigger than $R_{wr}$ (>10×), they nevertheless collectively consume significant additional power.

In the case of a read operation (on bit cell 704), corresponding selected word line is asserted, and all remaining unselected word lines are de-asserted. Appropriate voltages are set on WBL[0,1,2 . . . ], and on RBL[0,1,2 . . . ] to have current flow from/to WBL[i] to/from RBL[i]; and WBLn[0,1,2 . . . ] are floated. The intended functional current path for the read operation is shown with reference numeral "(4)," for cell 704 with resistance $R_{rd}$. The unintended paths during the read operation are shown with reference numeral "(3)," for cells 703/704, each with resistance $R_{rd}+R_{wr}$. However, it is noted that in this case, these unintended paths "(3)" during read operations do break read functionality, as the resistance change on the unintended paths can disguise, or be confused with, the resistance of the intended path.

Conventional Implementation 2—1T1J SHE-MRAM

In FIG. 8, a second conventional implementation related to a memory array comprising SHE-MRAM memory cells comprising 1T1J structures, is depicted. Once again, each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In this implementation, the connection between the Read Terminal and RBL[i] is switched on/off via a transistor controlled by the Word-line Select Terminal.

During a write operation on a particular bit cell (801) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. Following like reference numerals as FIG. 7, the intended functional current path is indicated as "(1)," for bit cell 801 with resistance $R_{wr}$. The unintended paths are shown as "(2)," each with resistance $R_{wr}$, for bit cells 801, 802, and 803. However, in this case, it must be noted that the unintended paths do break write functionality, as they induce unintended writes on bit cells 802 and 803.

In the case of a read operation (on bit cell 804), corresponding selected word line is asserted, and all remaining unselected word lines are de-asserted. Appropriate voltages are set on WBL[0,1,2 . . . ] and RBL[0,1,2 . . . ] (while WBLn[0,1, 2 . . . ], are floated), in order to have current flow from/to WBL[i]/WBLn[i] to/from RBL[i]. For read operations in this implementation, intended functional path is shown as "(4)," with resistance $R_{rd}$. There are no unintended paths, and therefore no breaks in read functionality.

Conventional Implementation 3—1T1J SHE-MRAM

In FIG. 9, a third conventional implementation related to a memory array comprising SHE-MRAM memory cells comprising 1T1J structures, is depicted. Once again, each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In this case, the connection between the Write Negated Terminal and WBLn[i] is switched on/off via a transistor controlled by the Word-line Select Terminal.

During a write operation on a particular bit cell (901) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. Following similar naming conventions as above, the intended functional current path is shown as "(1)," for bit cell 901 with resistance $R_{wr}$. The unintended paths are shown as "(2)," for cells 901 and 902, each with resistance $2R_{rd}+R_{wr}$. The unintended paths during the write operation do not break write functionality, as $R_{rd}$ is much bigger than $R_{wr}$ (>10×), although these unintended paths collectively consume significant additional power.

In the case of a read operation (on bit cell 904), corresponding selected word line is asserted, and all remaining unselected word lines are de-asserted. Appropriate voltages are set on WBLn[0,1,2 . . . ], and on RBL[0,1,2 . . . ] to have current flow from/to WBLn[i] to/from RBL[i]. For read operations in this implementation, intended functional path are shown as "(4)," with resistance $R_{rd}$. The unintended paths are shown as "(3)," for bit cells 903 and 904, each with resistance $R_{rd}+R_{wr}$. These unintended paths do break read functionality, as the resistance change on unintended paths can disguise that of the intended path.

From the above three conventional implementations, it is seen that the 1T1J structures are fraught with drawbacks which render such implementations unsatisfactory for easy and correct read/write operations on the SHE-MRAM structures. Accordingly, conventional implementations pertaining to 2T1J structures with two access transistors per MTJ for each bit cell are also considered below.

Conventional Implementation 4—2T1J SHE-MRAM

In FIG. 10, a fourth conventional implementation related to a memory array comprising SHE-MRAM memory cells comprising 2T1J structures, is depicted. Once again, each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In this case, the connection between the Write Terminal and WBL[i] is switched on/off via a first transistor controlled by the Word-line Select Terminal, and the connection between the Write Negated Terminal and WBLn[i] is switched on/off via a second transistor controlled by the Word-line Select Terminal.

During a write operation on a particular bit cell (1001) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. The intended functional current path is shown as "(1)," with resistance $R_{wr}$. There are no unintended paths, and therefore, there are no paths which break write functionality.

Another consideration which arises in this case is related to the transistor gate overdrive requirement due to bi-polar writing. As current flows from/to the Write Terminal to/from the Write Negated Terminal for writing logic 1/0 respectively, with WL[i] set to Vdd, and WBL[i] to Vdd/Vss, and WBLn[i] to Vss/Vdd, one of the two transistors display elevated Vgs, and Vgd=0, thus the drive strength of that transistor is significantly reduced. Accordingly, a typical solution to this reduced drive strength is to overdrive gate line WL[i], which results in a complicated design; or in increased transistor size, which reduces memory density.

In the case of a read operation (on bit cell 1002), corresponding selected word line is asserted, and all remaining unselected word lines are de-asserted. Appropriate voltages are set on WBLn[0,1,2 . . . ], and on RBL[0,1,2 . . . ] to have current flow from/to WBLn[i] to/from RBL[i]. WBLn[0,1, 2 . . . ] are set to have the same voltages as corresponding WBL[0,1,2 . . . ]. For read operations in this implementation, the intended functional path is shown as "(4)," with resistance $R_{rd}$. There are no unintended paths, and therefore, no related break in read functionality. Further, there does not arise a need for a transistor gate overdrive, as read operations are uni-polar.

Conventional Implementation 5—2T1J SHE-MRAM

In FIG. 11, a fifth conventional implementation related to a memory array comprising SHE-MRAM memory cells comprising 2T1J structures, is depicted. Once again, each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In this case, the connection between the Write Terminal and WBL[i] is switched on/off via a first transistor controlled by the Word-line Select Terminal, and the connection between the Read Terminal and RBL[i] is switched on/off via a second transistor controlled by the Word-line Select Terminal.

During a write operation on a particular bit cell (1101) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. The intended functional current path is shown as "(1)," with resistance $R_{wr}$. There are no unintended paths, and therefore, there are no paths which break write functionality.

Once again, the consideration related to the transistor gate overdrive requirement due to bi-polar writing arises. As current flow from the Write Terminal to the Write Negated Terminal for writing logic 1 with WL[i] setting to Vdd, WBL[i] to Vdd, and WBLn[i] to Vss, the transistors connecting the Write Terminal to WBL[i] display elevated Vgs, and Vgd=0, and therefore the drive strength of that transistor is significantly reduced. Accordingly, a typical solution to this reduced drive strength is to overdrive gate line WL[i] for that transistor, which results in a complicated design; or in increased transistor size, which reduces memory density.

In the case of a read operation (on bit cell 1102), corresponding selected word line is asserted, and all remaining unselected word lines are de-asserted. Appropriate voltages are set on WBLn[0,1,2 . . . ], and on RBL[0,1,2 . . . ] to have current flow from/to WBLn[i] to/from RBL[i]. WBL[0,1, 2 . . . ] are set to have the same voltages as corresponding WBL[0,1,2 . . . ]. For read operations in this implementation, the intended functional path is shown as "(4)," with resistance $R_{rd}$. There are no unintended paths, and therefore, no related break in read functionality. Further, there does not arise a transistor gate overdrive requirement as read operations are uni-polar.

Conventional Implementation 6—2T1J SHE-MRAM

In FIG. 12, a sixth conventional implementation related to a memory array comprising SHE-MRAM memory cells comprising 2T1J structures, is depicted. Once again, each bit cell has 4 terminals: a Word-line Select Terminal, a Write Terminal, a Write Negated Terminal, and a Read Terminal. The conventional implementation for each bit cell [i] involves connecting the Word-line Select Terminal to WL[i], the Write Terminal to WBL[i], the Write Negated Terminal to WBLn[i], and the Read Terminal to RBL[i]. In this case, the connection between the Read Terminal and RBL[i] is switched on/off via a first transistor controlled by the Word-line Select Terminal, and the connection between the Write Negated Terminal and WBLn[i] is switched on/off via a second transistor controlled by the Word-line Select Terminal.

During a write operation on a particular bit cell (1201) the corresponding selected word line is asserted, and all remaining unselected word lines are de-asserted. Appropriate voltages are accordingly set for WBL[0,1,2 . . . ] and WBLn[0,1, 2 . . . ], and RBL[0,1,2 . . . ] are floated. The intended functional current path is shown as "(1)," with resistance $R_{wr}$. There are no unintended paths, and therefore, there are no paths which break write functionality.

Once again, the consideration related to the transistor gate overdrive requirement due to bi-polar writing arises. As current flow to the Write Terminal from the Write Negated Terminal for writing logic 0 with WL[i] setting to Vdd, WBL[i] to Vss, and WBLn[i] to Vdd, the transistors connecting the Write Negated Terminal to WBLn[i] display elevated Vgs, and Vgd=0, and therefore the drive strength of that transistor is significantly reduced. Accordingly, a typical solution to this reduced drive strength is to overdrive gate line WL[i] for that transistor, which results in a complicated design; or in increased transistor size, which reduces memory density.

In the case of a read operation (on bit cell 1202), corresponding selected word line is asserted, and all remaining unselected word lines are de-asserted. Appropriate voltages are set on WBL[0,1,2 . . . ], and on RBL[0,1,2 . . . ] to have current flow from/to WBL[i] to/from RBL[i]. WBLn[0,1, 2 . . . ] are set to have the same voltages as corresponding WBL[0,1,2 . . . ]. For read operations in this implementation, the intended functional path is shown as "(4)," with resistance $R_{rd}$. There are no unintended paths, and therefore, no related break in read functionality. Further, there does not arise a transistor gate overdrive requirement as read operations are uni-polar.

Accordingly, it is seen that the implementation of SHE-MRAM using conventional SHE/GSHE switched MTJs (for example, as taught in International Application No. WO 2014/025838 to Buhrman et al., entitled "Electrically gated three-terminal circuits and devices based on spin hall torque effects in magnetic nanostructures,") and as discussed above with regard to conventional implementations 1-6, suffer from numerous drawbacks. For conventional implementations 1-3 which may improve density with 1T1J structures, it is seen that there are many breaks in read/write functionalities. For 2T1J conventional implementations 4-6, adding an extra access transistor, at the cost of lower density can accomplish read/write functionality in many cases, but are not efficient due to requirements of the overdrive voltages, and other drawbacks discussed in detail above.

However, it is desirable to achieve high density memory structures which can fully exploit the advantages of SHE/GSHE, while avoiding drawbacks related to transistor gate overdrive voltages, increased transistor sizing, and need for 2T1J structures. In other words, it is desirable to achieve memory structures which include 3-terminal devices based on GSHE principles, and which can accomplish high density and superior performance, in comparison to the above conventional implementations and conventional 2-terminal STT-MTJ devices.

SUMMARY

Exemplary embodiments include systems and methods directed to a memory element and arrangement of the memory elements in a memory array, wherein the memory element comprises a hybrid giant spin Hall effect (GSHE)-spin transfer torque (STT) magnetoresistive random access memory (MRAM) element. The GSHE-STT MRAM element includes a GSHE strip formed between a first terminal (A) and a second terminal (B), and a magnetic tunnel junction (MTJ), with a free layer of the MTJ interfacing the GSHE strip, and a top electrode of the MTJ coupled to a third terminal (C). In the exemplary embodiments, a magnetization of an easy axis of the free layer is substantially perpendicular to the magnetization direction created by electrons traversing the SHE/GSHE strip between the first terminal and the second terminal, such that the free layer of the MTJ is configured to switch based on a first charge current injected from/to the first terminal to/from the second terminal and a second charge current injected or extracted (i.e., positive/negative current directions) through the third terminal into or out of the MTJ through the top electrode.

In some aspects, the MTJ of the memory element is switched into high resistance state representing logic 1 when the free layer is switched to be anti-aligned or anti-parallel to a fixed layer of the MTJ; and the MTJ is switched into a low resistance representing logic 0, when the free layer is switched to be aligned or parallel to the fixed layer.

In some aspects, the memory element may further comprise an access transistor to form the memory bit cell in a memory array, wherein a drain terminal of the access transistor is connected to the third terminal.

Exemplary embodiments also include a memory array comprising one or more of the exemplary memory cells, wherein gate terminals of access transistors of all memory elements in a row of the memory array are connected to a word line for enabling or disabling access to the memory cells in the row. A first word line of the memory array may be connected to a first access transistor of a first memory cells, wherein the first word line is asserted for programming or sensing the first memory cell and all remaining word lines of the memory array are de-asserted.

Further, drain terminals of access transistors of all memory cells in a first column of the memory array may be connected to a first bit line for programming or sensing memory elements of the first column.

In some aspects, the first bit line is set to a first voltage for programming the memory elements in the first column to logic 0, and the first bit line is set to a second voltage for programming the memory elements in the first column to logic 1.

Further, the first bit line may be connected to a sensing circuit or sensing means for sensing a resistance state or logic value stored in the memory elements in the first column.

In some embodiments of the exemplary memory array, all memory cells in a first row are coupled in parallel to one another through the first terminal (A) and the second terminal (B) of each of the memory elements, wherein the first terminals (A) of memory elements of a first row are connected together and driven by a first voltage when the first row is accessed for programming or sensing; and the second terminals (B) of memory elements of the first row are connected together and driven by a second voltage when the first row is accessed for programming or sensing. In some aspects, the memory elements of only a segment comprising a subset of the memory elements of the first row are connected together. Moreover, in some aspects, the first voltage and the second voltage may be approximately half of a positive supply voltage (VDD).

In some exemplary embodiments of the memory array, a first, second, and third memory element of a first row are connected in series, such that a second terminal (B) of the first memory element of a first row is connected to a first terminal (A) of the second memory element of the first row, and the second terminal (B) of the second memory element is connected to a first terminal (A) of the third memory element in the first row. The first terminal (A) of the first memory element is driven by a first voltage when the first row is accessed for programming or sensing, and the second terminal (B) of the third memory element is driven by a second voltage when the first row is accessed for programming or sensing, in some exemplary aspects. Further, the first, second, and third memory elements may be part of a segment comprising a subset of the memory elements of the first row. Moreover, in some aspects, the first voltage and the second voltage may be approximately half of a positive supply voltage (VDD).

BRIEF DESCRIPTION OF THE DRAWINGS

The accompanying drawings are presented to aid in the description of embodiments of the invention and are provided solely for illustration of the embodiments and not limitation thereof.

FIG. 5C illustrates known research advancements in SHE/GSHE along with the corresponding values for $\theta_{SH}$ that were achieved.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments overcome the limitations of conventional implementations to provide solutions for high density low power MRAM with hybrid SHE/GSHE-STT-switched MTJs as memory elements and corresponding array structures of 1T1J memory cells. Details of exemplary embodiments will be provided in the following sections with reference to the figures.

Figure 6A:
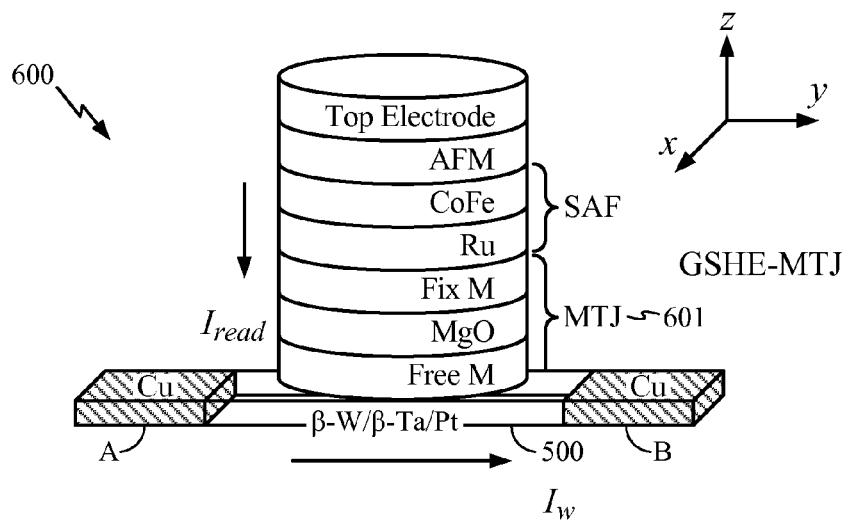
FIG. 6A illustrates a side view of memory cell 600 formed by exploiting the SHE.
Figure 13A:
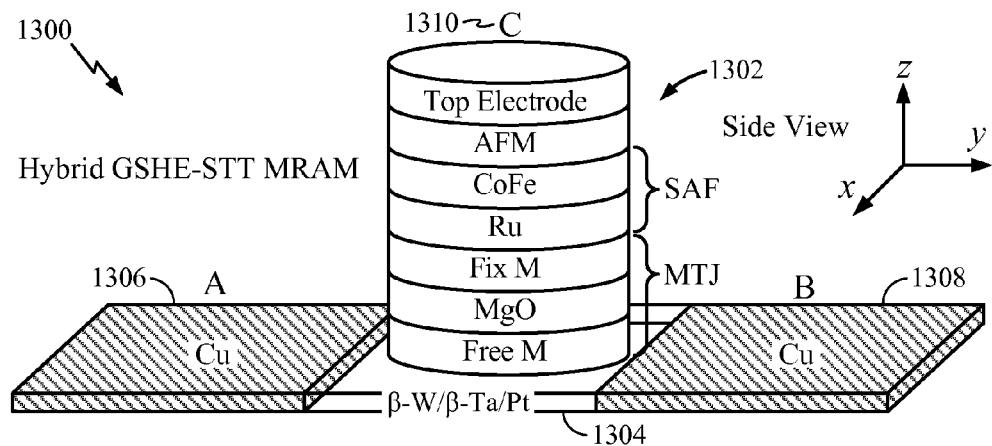
FIG. 13A illustrates a side view of an exemplary memory element 1300 formed from exemplary hybrid GSHE-STT-switched MRAM bit cells.

With reference to FIG. 13A, a side view of an exemplary memory cell 1300 is provided. In some aspects, memory element 1300 is similar to memory element 600 of FIG. 6A. With regard to the similarities, memory cell 1300 also comprises a spin-orbital-coupling (SOC) strip, and more specifically GSHE strip 1304 (or a GHSE means for coupling) is shown between first terminal (A) 1306 and second terminal (B) 1308. MTJ 1302 is stacked on top of GSHE strip 1304, with a free layer interfacing GSHE strip 1304 and a fixed layer coupled to third terminal (C) 1310. MTJ 1302 of memory cell 1300 may also include the additional elements related to the AFM layer and Ru, CoFe layers represented as SAF layers. However, a significant difference between conventional memory element 600 and exemplary memory element 1300 can be observed with reference to FIG. 13B below.

Figure 1A:
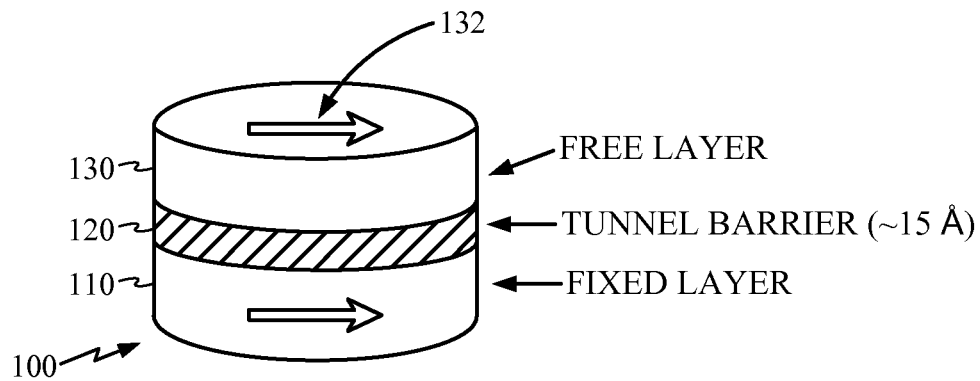
FIGS. 1A and 1B are illustrations of a magnetic tunnel junction (MTJ) storage element.
Figure 1B:
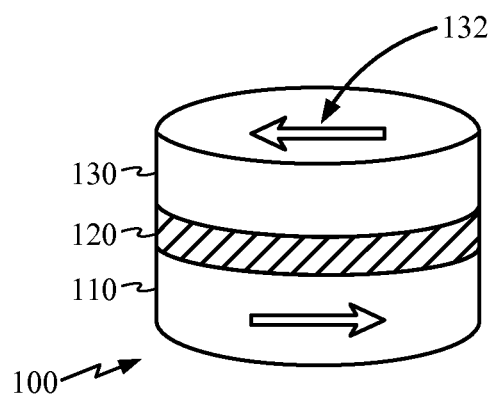
Figure 2:
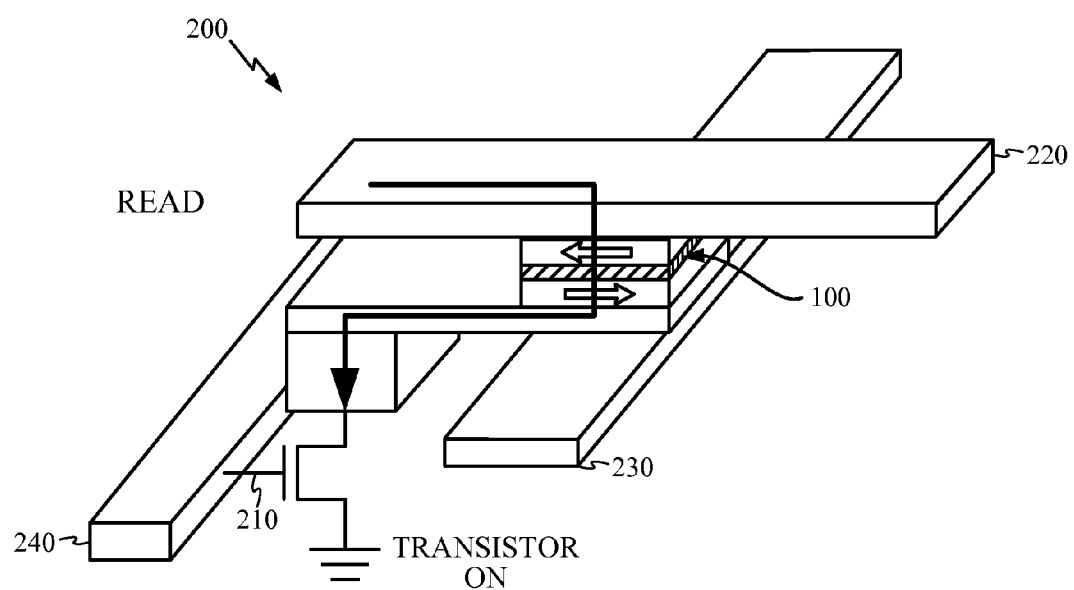
FIG. 2 is an illustration of a conventional field switched Magnetoresistive Random Access Memory (MRAM) cell during read operations.
Figure 3A:
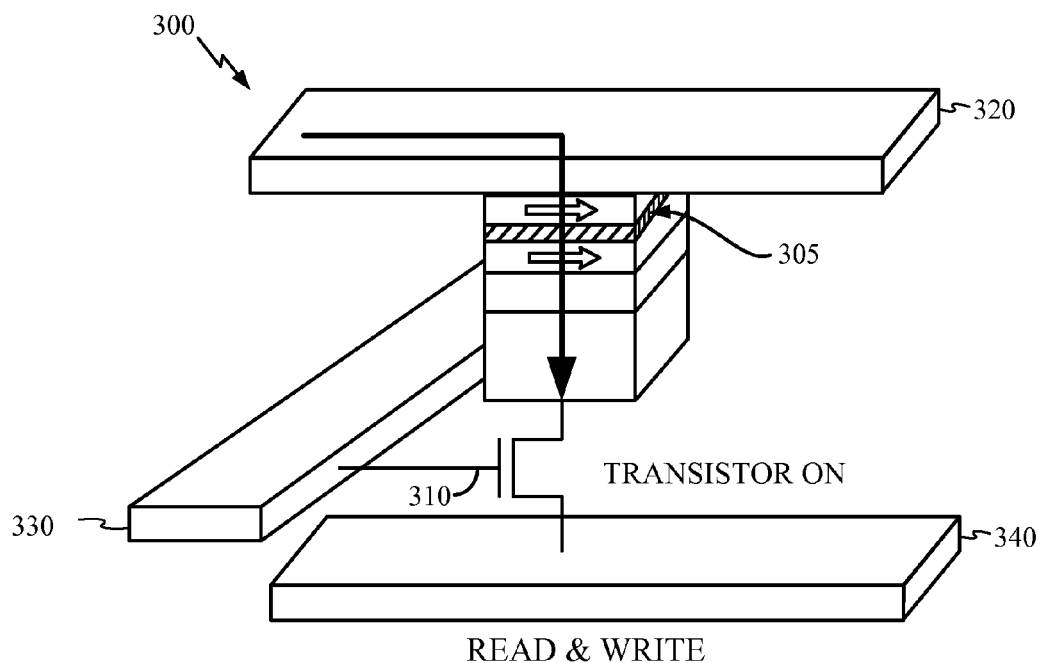
FIGS. 3A and 3B are illustrations of Spin Transfer Torque Magnetoresistive Random Access Memory (STT-MRAM) cells.
Figure 3B:
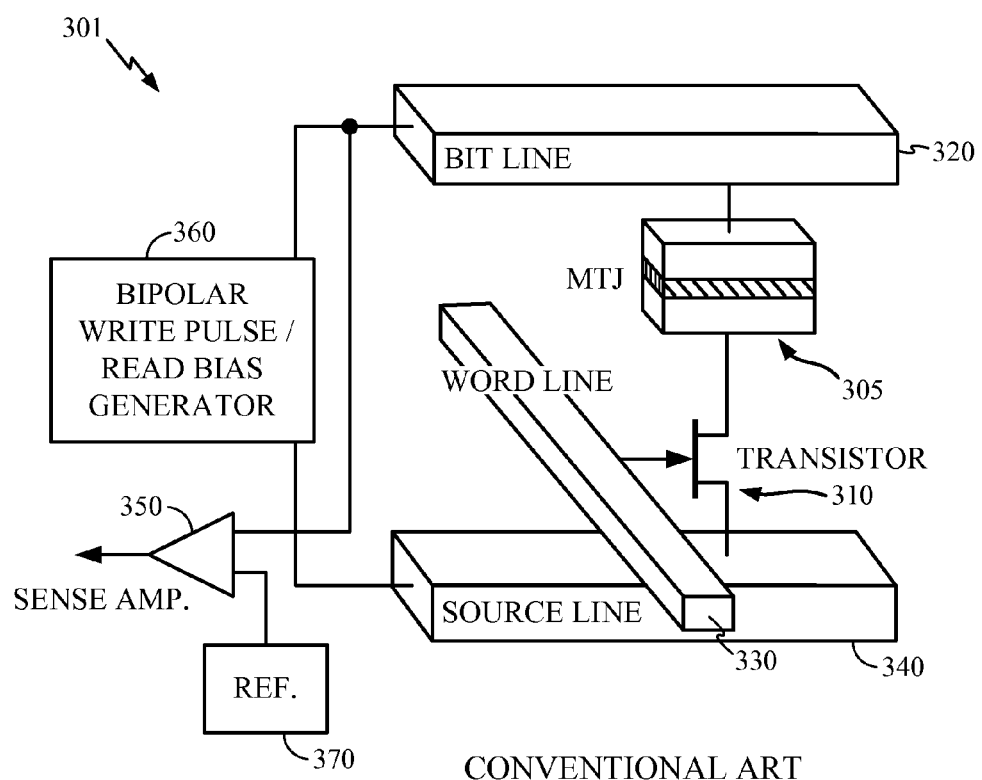
Figure 4:
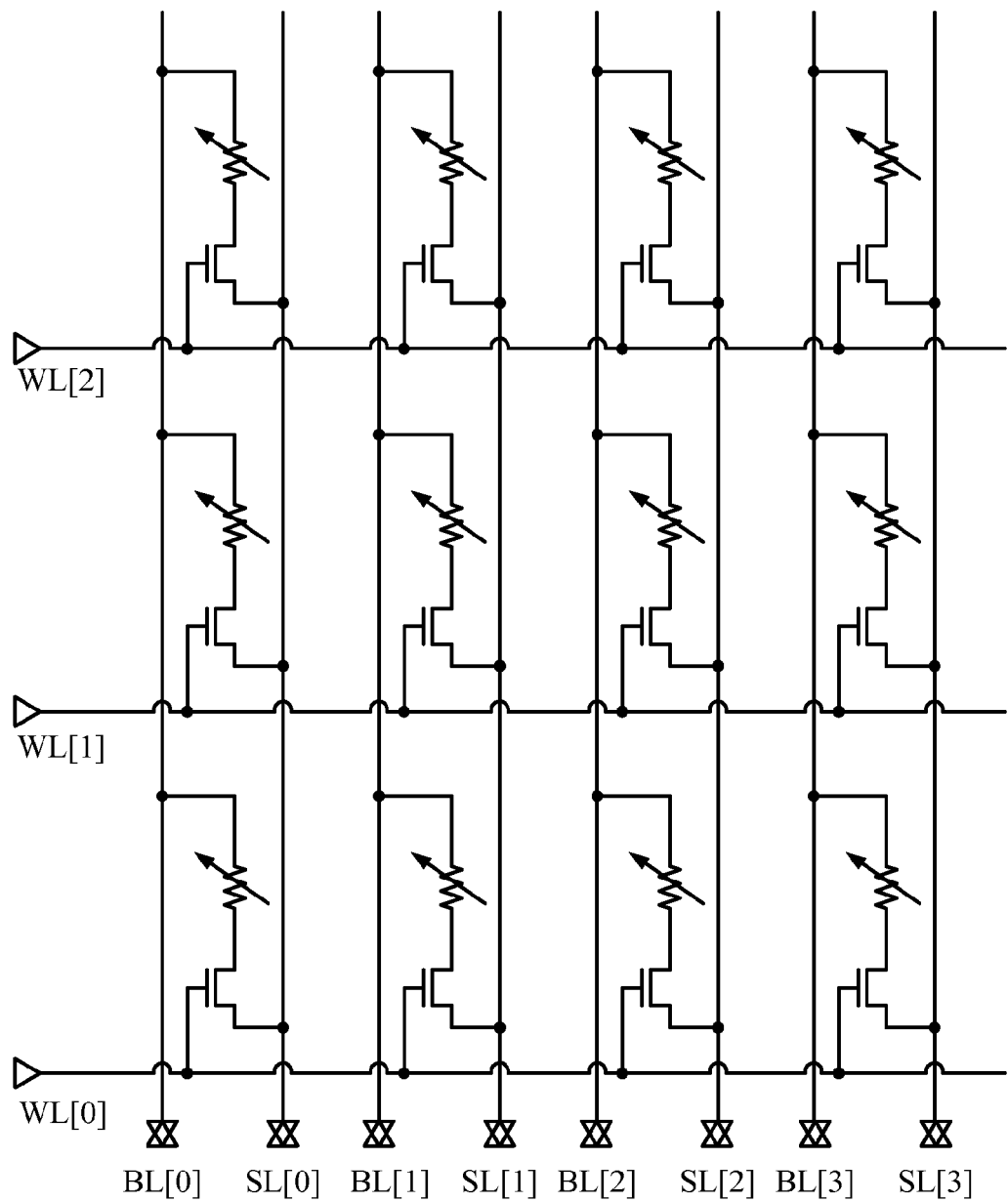
FIG. 4 illustrates a conventional memory array comprising STT-MRAM cells.
Figure 5A:
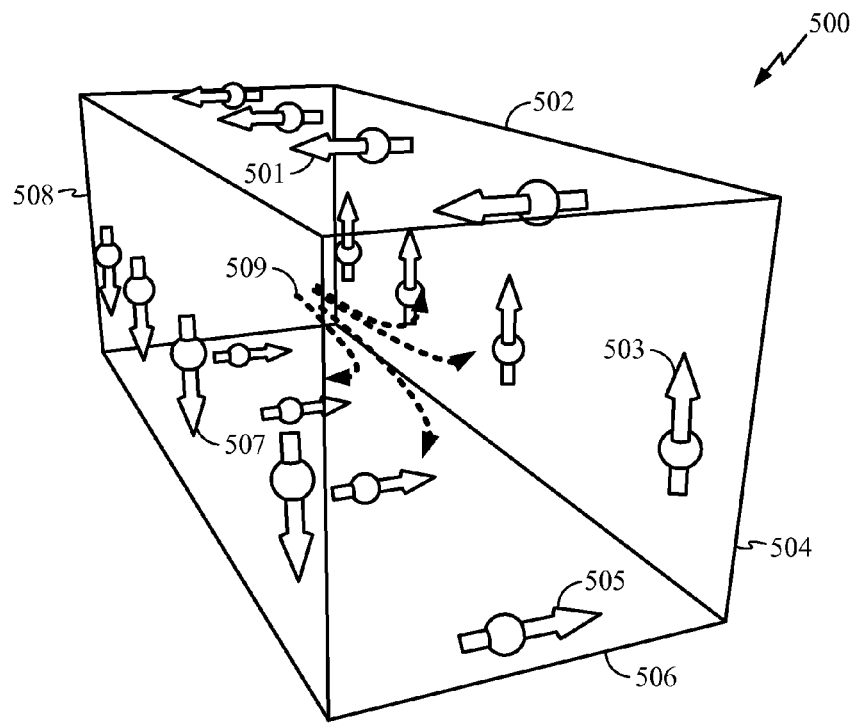
FIGS. 5A-B illustrate a conductor displaying SHE and use of SHE in magnetic switching.
Figure 5B:
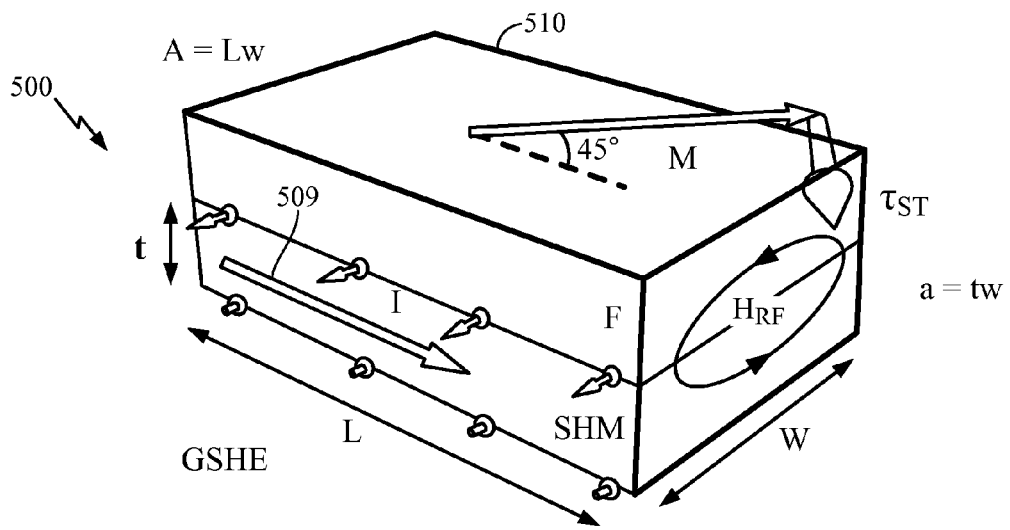
Figure 6B:
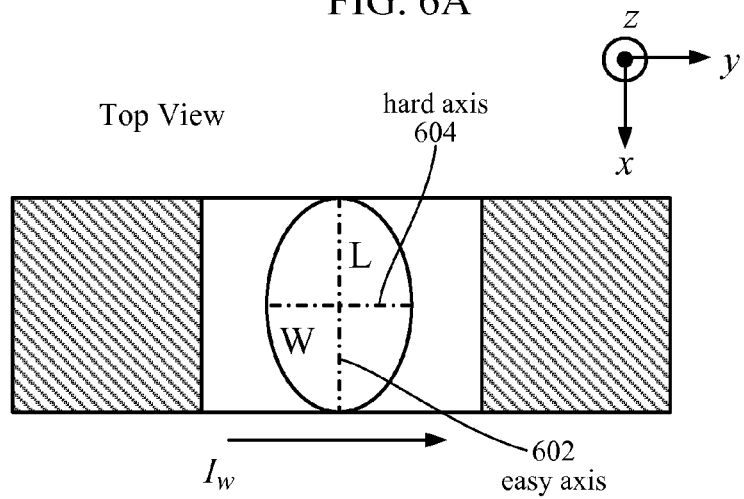
FIG. 6B is a top view of memory cell 600 of FIG. 6A.
Figure 6C:
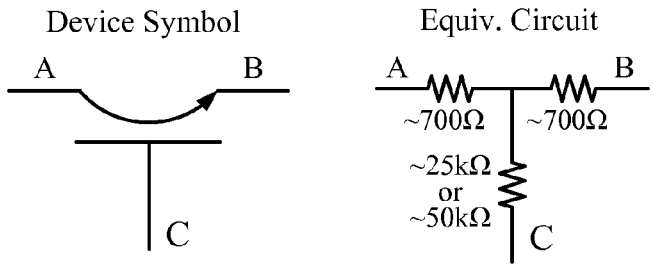
FIG. 6C illustrates a device symbol and an equivalent circuit of memory cell 600 of FIG. 6A.
Figure 7:
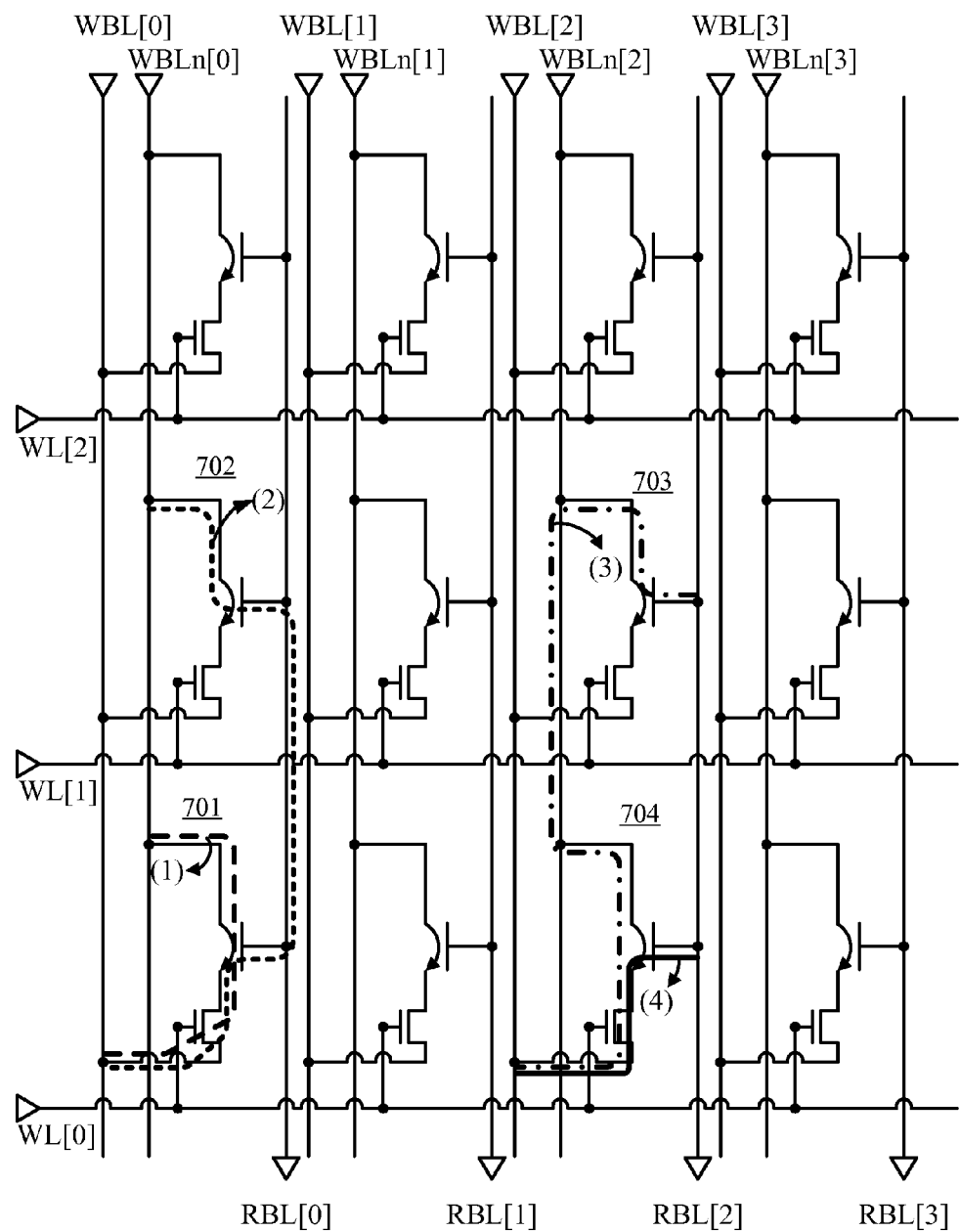
FIG. 7 illustrates a first implementation of SHE/GSHE-MRAM related to a memory array comprising conventional SHE/GSHE MTJs in 1T1J structures.
Figure 8:
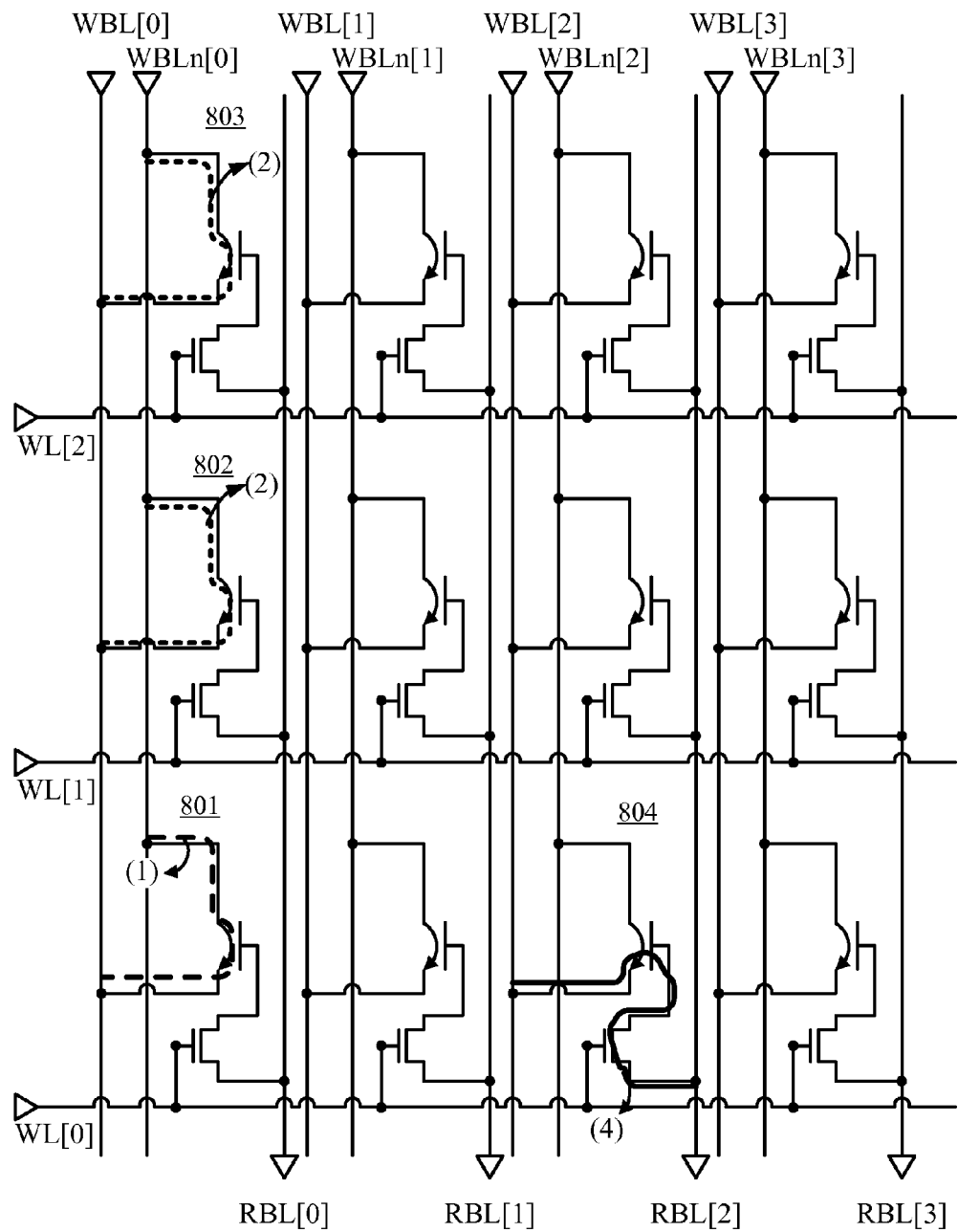
FIG. 8 illustrates a second implementation of SHE/GSHE-MRAM related to a memory array comprising conventional SHE/GSHE MTJs in 1T1J structures.
Figure 9:
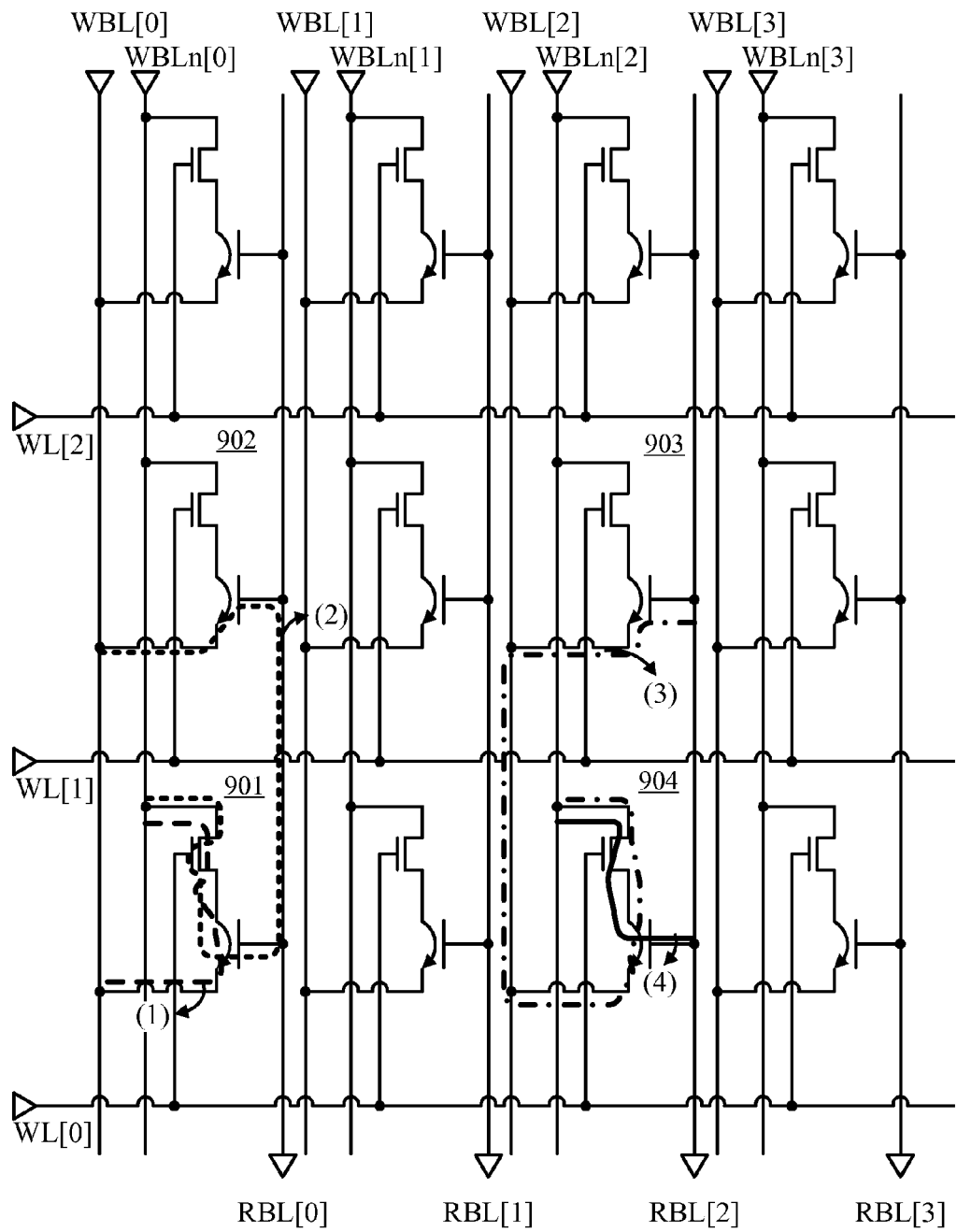
FIG. 9 illustrates a third implementation of SHE/GSHE-MRAM related to a memory array comprising conventional SHE/GSHE MTJs in 1T1J structures.
Figure 10:
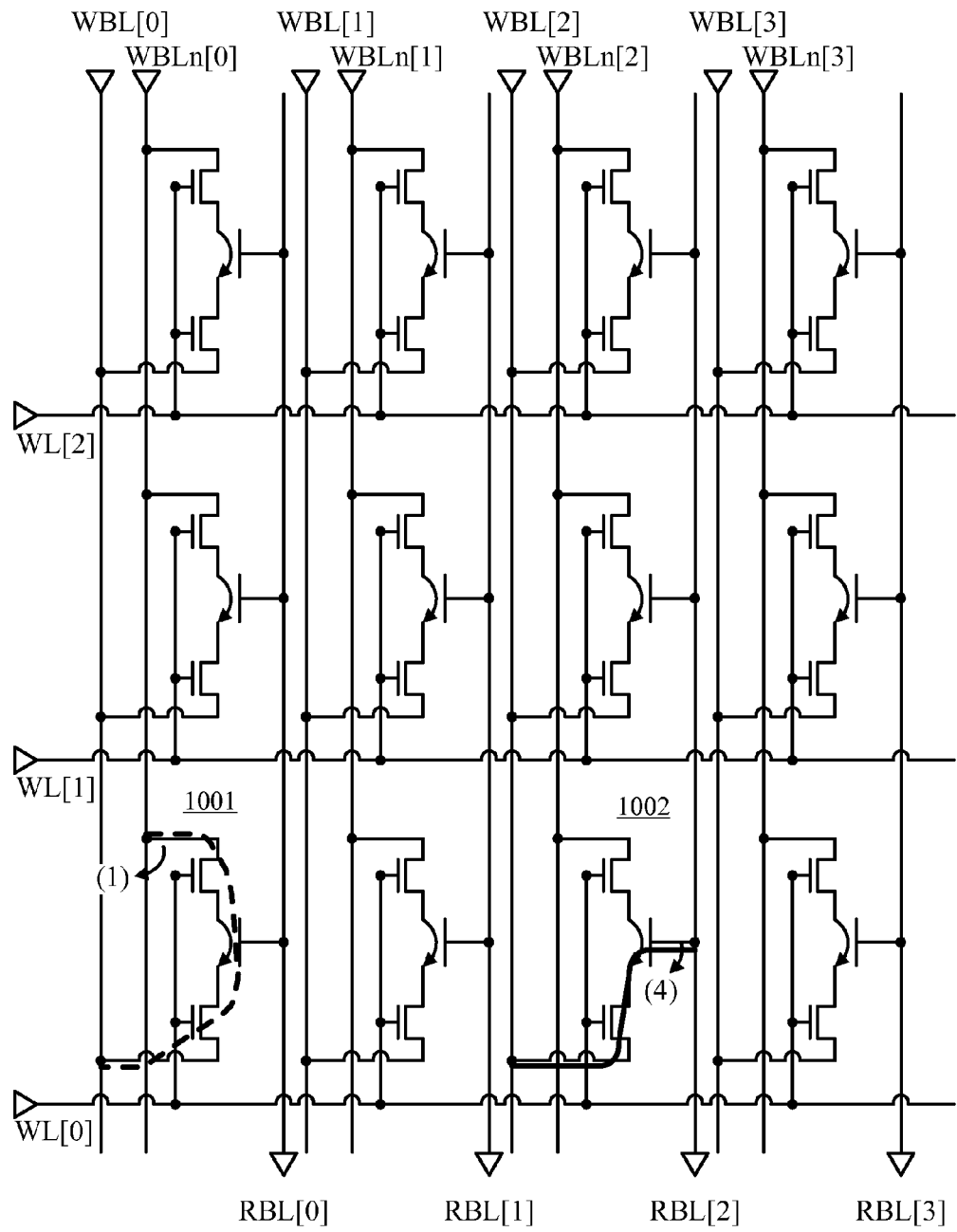
FIG. 10 illustrates a fourth implementation of SHE/GSHE-MRAM related to a memory array comprising conventional SHE/GSHE MTJs in 1T1J structures.
Figure 11:
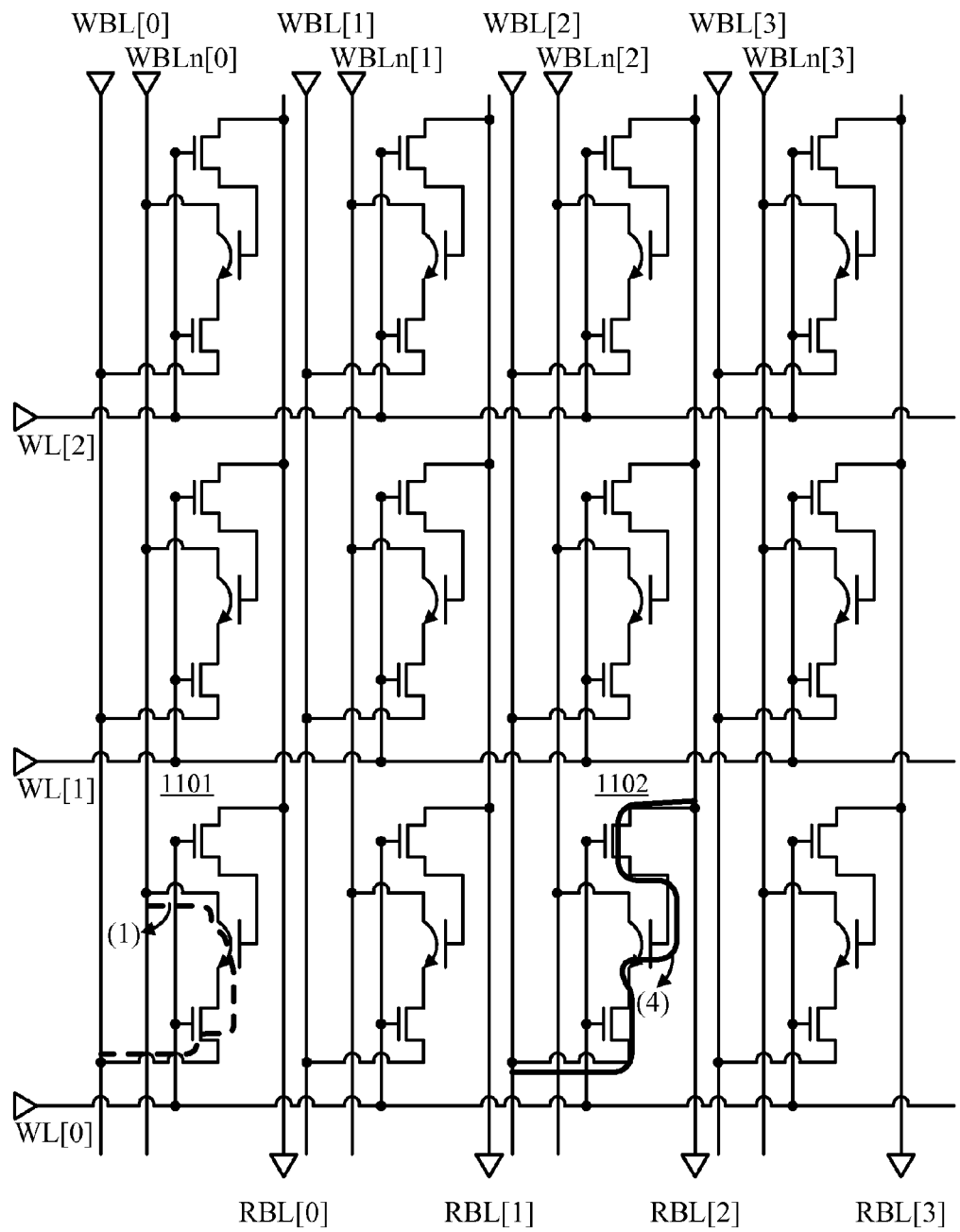
FIG. 11 illustrates a fifth implementation of SHE/GSHE-MRAM related to a memory array comprising conventional SHE/GSHE MTJs in 1T1J structures.
Figure 12:
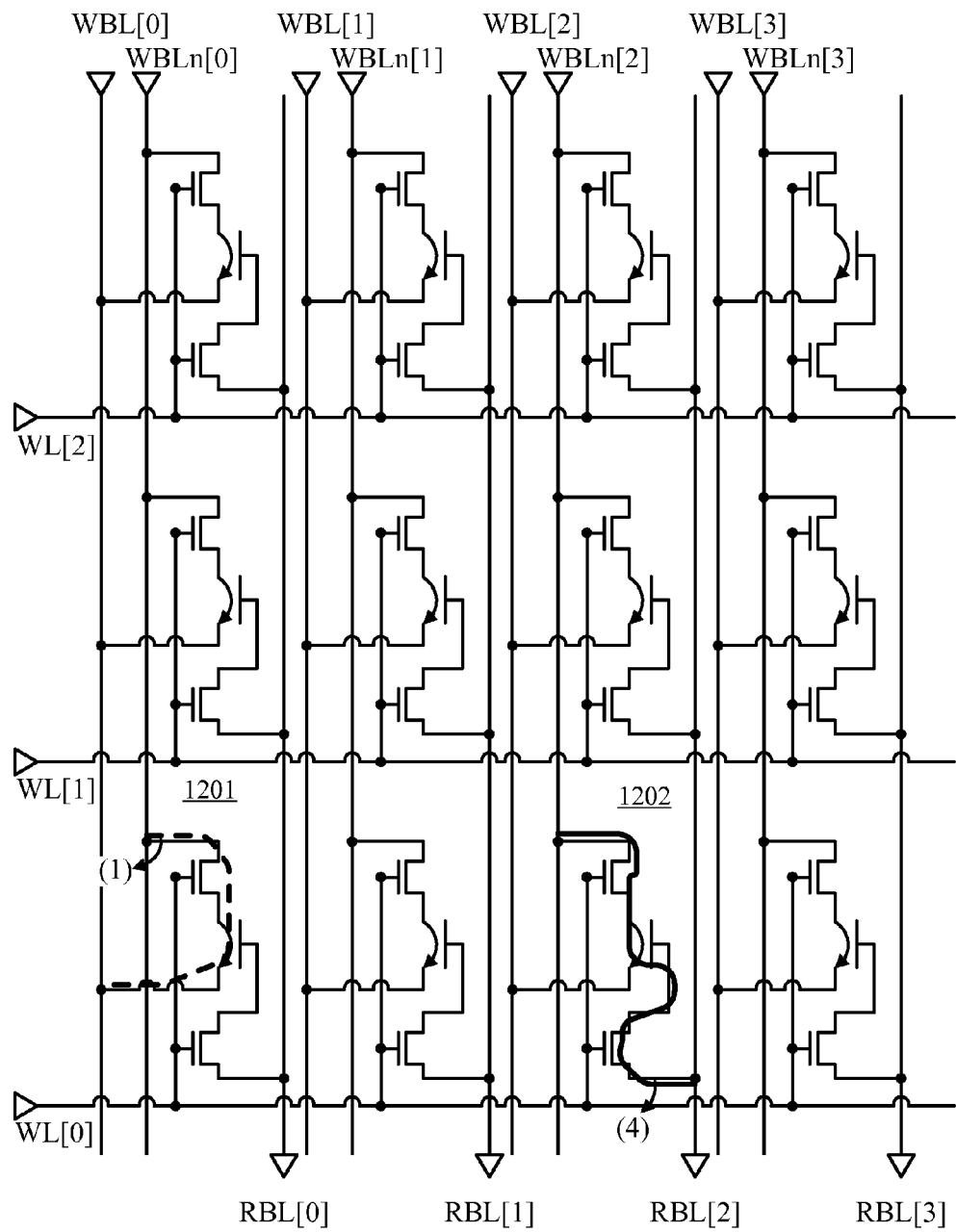
FIG. 12 illustrates a sixth implementation of SHE/GSHE-MRAM related to a memory array comprising conventional SHE/GSHE MTJs in 1T1J structures.
Figure 13B:
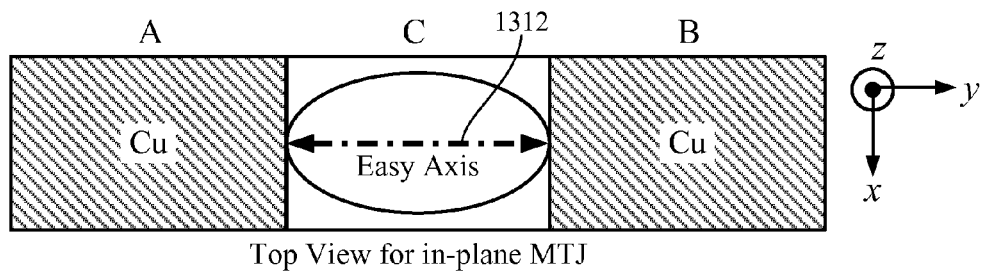
FIG. 13B illustrates a top view of memory cell 1300 depicted in FIG. 13A, with an in-plane MTJ.

Referring to the top view of memory cell 1300 depicted in FIG. 13B, it is seen that in contrast to easy axis 602 of FIG. 6B, MTJ 1302 of memory element 1300 is oriented such that easy axis 1312 of MTJ 1302 is formed to be aligned with the y-axis or in the y direction. Referring back to FIG. 5A, it is seen that this alignment results in the easy axis 1312 of MTJ 1302 of exemplary memory element 1300 being perpendicular to the GSHE induced spin orientation (i.e., along direction 501). In other words, the magnetization along easy axis 1312 of the free layer of MTJ 1302 is substantially perpendicular to the magnetization direction created by electrons traversing GSHE strip 1304 between first terminal 1306 and second terminal 1308. As a result, memory element 1300 results in a much more efficient design, which will be explained with reference to FIGS. 14A-B.

Figures 14A, 14B:
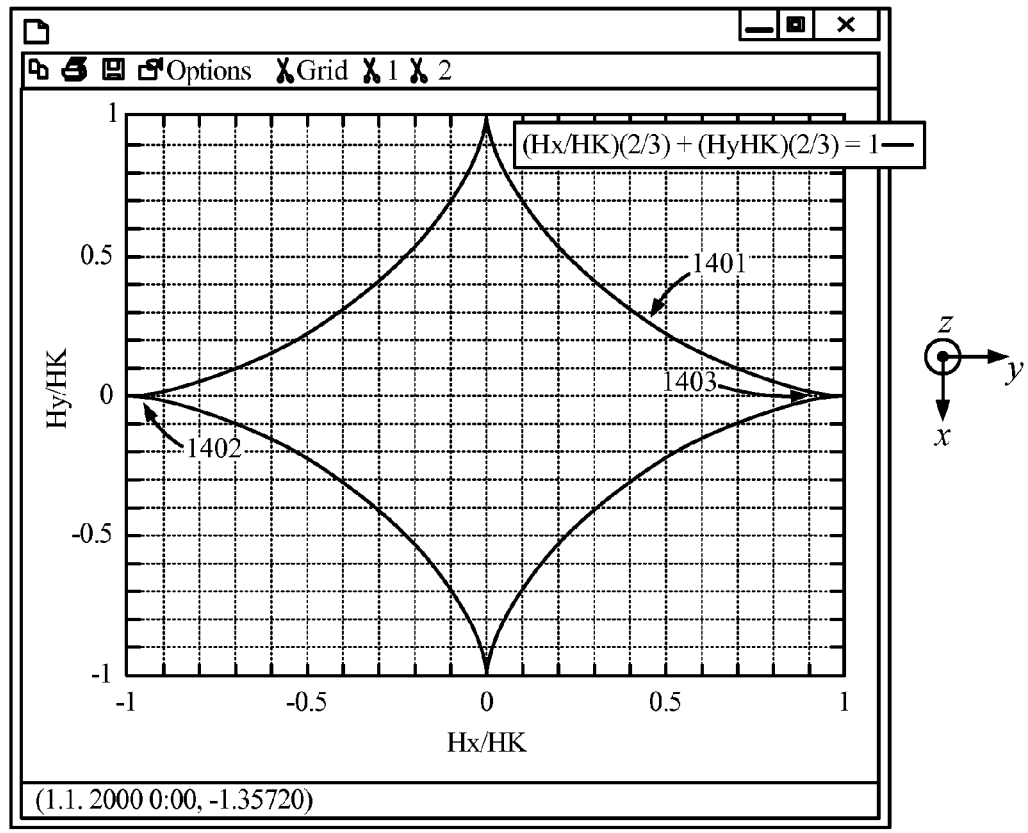
FIG. 14A illustrates the well-known Stoner-Wohlfarth astroid curve.
FIG. 14B illustrates well-known equations pertaining to the Stoner-Wohlfarth switching astroid of FIG. 14A.

In FIG. 14A, the well-known Stoner-Wohlfarth astroid is depicted. Briefly, the Stoner-Wohlfarth astroid or curve is a geometric representation of the Stoner-Wohlfarth model. As depicted, discontinuous changes of magnetization can occur when the curve is traversed. More specifically, tangents (i.e., x and y axes) to the astroid represent magnetization directions with extremal energy, i.e. either local minima or local maxima. For a system with a uniaxial anisotropy the tangent(s) that are closest to the easy axis lead to stable solutions, i.e. minimal energy. With relation to the GSHE direction, it is observed that if the magnetization direction of the GSHE strip is offset from the easy axis of the MTJ (e.g., easy axis 1312 of MTJ 1302), the switching current (which in this case is the required current that passes through terminal C to switch the MTJ with spin-transfer torque (STT), under full assistance of giant spin Hall effect (GSHE)) is much smaller, as depicted by a crest such as "1401" in FIG. 14A. If, on the other hand, the easy axis is aligned with the GSHE magnetization direction, (e.g., easy axis 602 of conventional memory cell 600 of FIG. 6B), then the switching current (which in this case is the required current that passes through terminal C to switch the MTJ with spin-transfer torque (STT), under partial or no assistance of giant spin Hall effect (GSHE)) would be higher, as depicted by extremal points 1402/1403 on the astroid. FIG. 14B provides well-known equations pertaining to the Stoner-Wohlfarth switching astroid of FIG. 14A.

Referring back to FIGS. 13A-B, with the easy axis 1312 (along the depicted y-axis) perpendicular to the GSHE magnetization or spin orientation (along the depicted x-axis), memory element 1300 is designed to enable switching the free layer of MTJ 1302 when there is current through third terminal (C) 1310, which has much lower switching threshold when there is an assisting current flow between first and second terminals (A and B) 1306 and 1308 (in either direction), based on the Stoner-Wohlfarth switching astroid of FIG. 14. It will be recognized that in exemplary memory element 1300, the switching of MTJ 1302 is based on a combination of a first charge current related to due to the GSHE based magnetization, as well as, a second charge current related to spin-torque transfer (STT) switching in the perpendicular direction (y-axis in FIG. 13B, or z-axis in FIG. 13C, for example). Accordingly, the combination is referred to as a hybrid GSHE-STT MRAM switching; MTJ 1302 is referred to as a GSHE-STT MTJ; and the MRAM made from the GSHE-STT MTJ is referred to as a GSHE-STT MRAM.

The GSHE-STT MRAM element includes means for switching the MTJ into high or low resistance states as follows. When a first charge current from/to first terminal A 1306 to/from second terminal B 1308 is no less than a threshold (~20 uA), MTJ 1302 switches to state '0' (low MTJ resistance) if there is sufficient second charge current flow extracted out of MTJ 1302 through third terminal C 1310 (where the third terminal C 1310 is coupled to the top electrode of MTJ 1302, for example). Similarly, MTJ 1302 switches to state '1' (high MTJ resistance) if there is sufficient second charge current injected into MTJ 1302 through third terminal C 1310. When the first charge current from/to first terminal A 1306 to/from second terminal B 1308 is less than the threshold (~20 uA) and the second charge current flows into or out of third terminal C 1310 is small as well, the previous state (either '0' or '1') of MTJ 1302 is maintained.

Thus, in general, an embodiment can include a hybrid GSHE-STT MRAM means or GSHE-STT MRAM element (e.g., GSHE-STT MTJ 1300) comprising a GSHE means for coupling or a GSHE strip (e.g., GSHE 1304) formed between a first terminal (e.g., A 1306) and a second terminal (e.g., B 1308). The GSHE-STT MRAM element further includes a MTJ (e.g., MTJ 1302), with a free layer of the MTJ interfacing the GSHE strip. A fixed layer of the MTJ is coupled to a third terminal (e.g., C 1310). The orientation of the easy axis (e.g., easy axis 1312) of the free layer is perpendicular to the magnetization created by electrons traversing the GSHE strip between the first terminal and the second terminal, such that the free layer of the MTJ is configured to switch based on a first charge current injected from/to the first terminal to/from the second terminal and a second charge current injected/extracted through the third terminal into/out of the MTJ through the third terminal (e.g., coupled to the top electrode) into/out of the MTJ via the fixed layer of the MTJ.

Figure 13C:
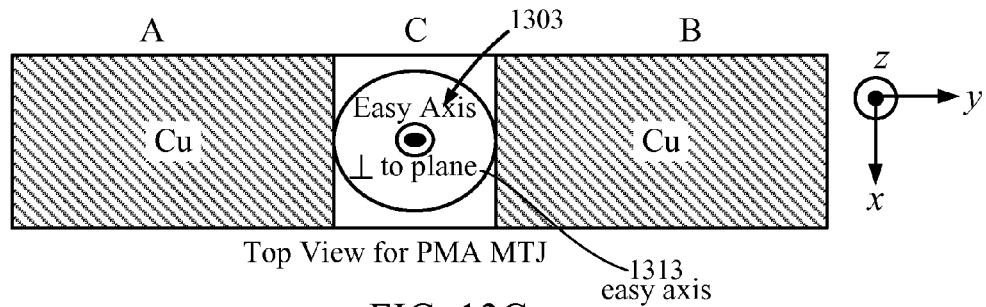
FIG. 13C illustrates a top view for an exemplary memory cell 1300 comprising a perpendicular magnetic anisotropy (PMA) MTJ.
Figure 13D:
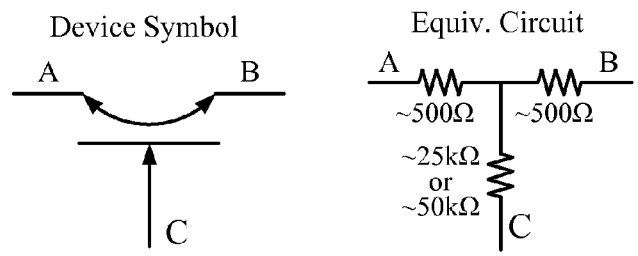
FIG. 13D illustrates a device representation or symbol, along with an equivalent circuit, of an exemplary memory element 1300.

With reference to FIG. 13D, a device representation or symbol of an exemplary memory cell 1300 is shown, with the double arrows between first and second terminals "A" and "B" indicating the dual direction in which current flow may affect switching of the free layer of the MTJ coupled to third terminal "C." From the equivalent circuit representation, it is seen that the resistance between the terminals A, and B of the 3-terminal memory element 1300 is extremely low, (in the order of a few hundred ohms), and therefore, the MTJ can be programmed with ease.

FIG. 13B depicts the top view for exemplary memory element 1300 for an in-plane MTJ. With reference to FIG. 13C, the top view for an exemplary memory element 1300 comprising a perpendicular magnetic anisotropy (PMA) (or simply, "perpendicular MTJ"), MTJ 1303, where easy axis 1313 of PMA MTJ 1303 is perpendicular to the plane (i.e., z-axis or z direction). Once again, easy axis 1313 is perpendicular to the GSHE magnetization or spin orientation along the x-axis, and the operation of the embodiment of memory cell 1300 comprising PMA MTJ 1303 stacked on a GSHE strip 1304 according to FIG. 13C is similar to that explained above with reference to the in-plane MTJ 1302 of FIG. 13B.

Accordingly, exemplary embodiments are directed to memory arrays comprising GSHE-STT MTJs formed from hybrid GSHE-STT topologies. These exemplary GSHE-STT MTJs comprise three terminals (A, B, and C), which will be described with regard to the following embodiments.

Embodiment 1—High Density

Figure 15:
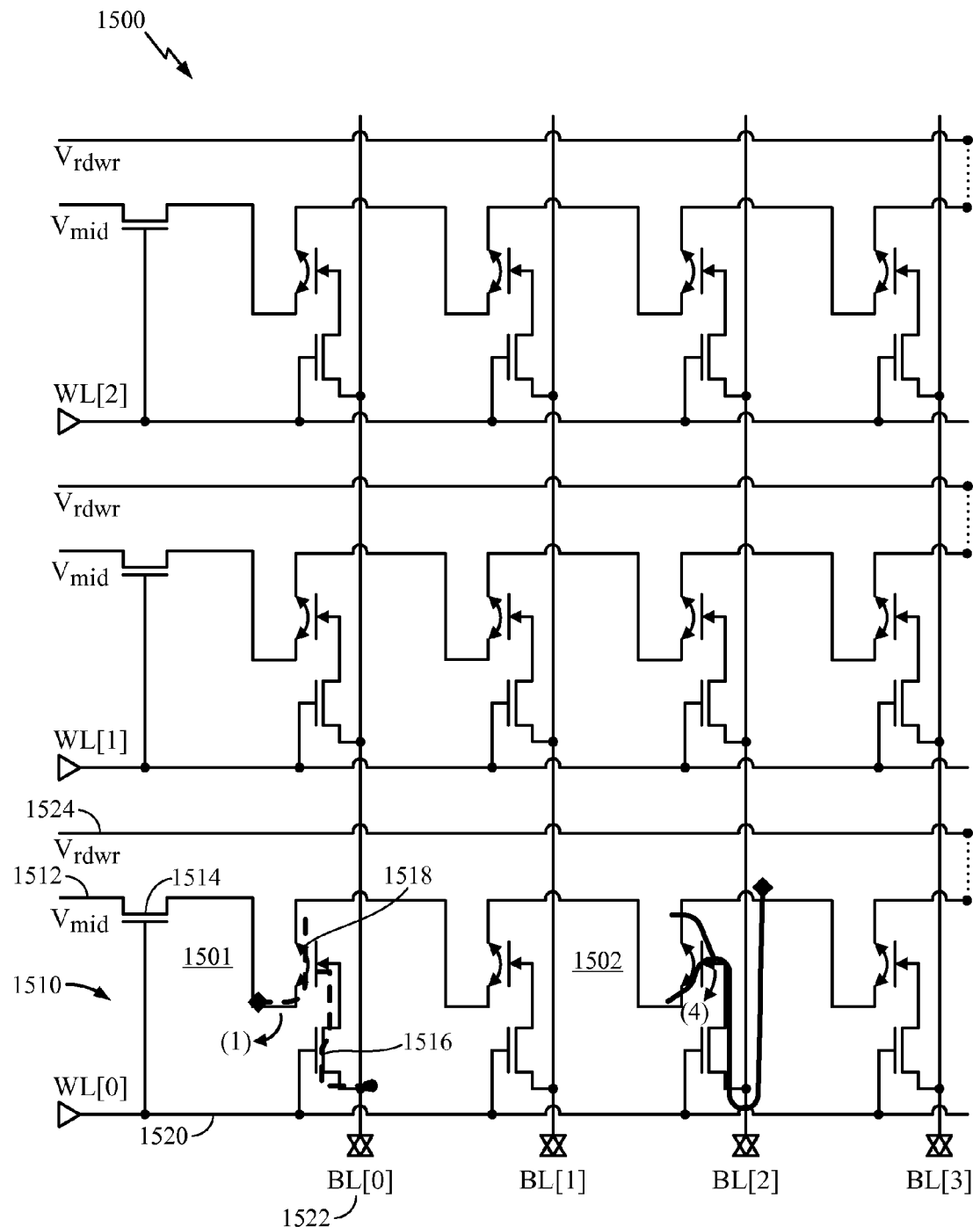
FIG. 15 illustrates a first exemplary embodiment of a memory array structure formed with a circuit topology comprising exemplary hybrid GSHE-STT-switched memory elements in 1T1J structures.

With reference to FIG. 15, a first exemplary embodiment of a memory array structure 1500 formed with a circuit topology comprising exemplary hybrid GSHE-STT memory elements (e.g., memory element 1300) is illustrated. Embodiment 1 relates to circuit topologies geared for high density, which include an exemplary hybrid GSHE-STT MTJ and an access transistor per bit cell. Within an exemplary row 1510 for example, the read and write assistance paths (path between first and second terminals A and B) of the GSHE-STT MTJs of bit cells within a predetermined segment comprising a number of columns (e.g., 8) are connected in series and to a shared gating transistor 1514. Gating transistor 1514 is connected to a midpoint voltage (Vmid) 1512 whose value may lie close to Vdd/2. Using this midpoint voltage eliminates the need for true and complement bit lines as in conventional implementations 1-6 of FIGS. 7-12. Vmid 1512 is connected to the first GSHE-STT cell (e.g., 1501) of row 1510 through the shared gating transistor 1514. Representatively, read/write terminal C of GSHE-STT cell 1501 is connected to a drain/source of an access transistor 1516, where the gate of access transistor 1516 is connected to the word lines WL[0] 1520 for example. Correspondingly, the source/drain of access transistor 1516 is connected to bit lines BL[0] 1522 for example. Similarly for all cells of array 1500 with access transistors connected to word lines WL[0, 1, 2, . . . ] and bit lines BL[0, 1, 2, . . . ] as shown. Moreover the other end of series connection of GSHE-STT MTJ read and write assistance paths within row 1510 is connected a signal line Vrdwr 1524, which is set to voltage ~Vmid=Vdd/2 for read operation, and to Vmid+Δ for write operation, such that the need for true and complementary bit lines connected to positive and negative supply voltage can be avoided for bipolar MTJ programming/switching.

Following the previous naming conventions, with reference to the operation of exemplary cells in memory array 1500, an intended write path for cell 1501 is shown as "(1)," and an intended read path for cell 1502 is shown as "(4)." Unlike conventional implementations 1-6, there are no unintended read or write paths herein.

Advantageous aspects of the exemplary embodiment 1 include improved amenability of programming current and voltage, for controlling the read/write with access transistors sized to the smallest/minimum possible sizes. The illustrated structures share WL[0]-[2] across multiple columns in order to improve density. Accordingly, to mitigate the impact of $V_{offset}$, ie., the voltage drop across the write assistance paths that are put in series connection, the structures may be divided into segments comprising small numbers of columns, e.g. for 8 columns. In an example, for the case of a write operation, when passing the write assistance current $I_W$=15 uA, the offset voltage across the overall write assistance path is given by $V_{offset}$=15 uA*1KΩ*8=120 mV, which is acceptable for when Δ>120 mV is used; and for the case of a read operation with read current on each bit line $I_R$=5 uA, the offset voltage across the overall read assistance path is $V_{offset}$=(4+3+2+1)*5 uA*1KΩ=50 mV, which corresponds to signal voltage of $V_{signal}$=5 uA*25KΩ=125 mV. This gives rise to a large signal to noise/interference ratio $V_{signal}/V_{offset}$=3. Another advantageous aspect relates to a small layout, which can be made much more compact for series connections of GSHE-STT MTJs.

However, it is possible that embodiment 1 may require special consideration of voltage drop offsets along the series connection line of memory cells, connected to a particular word line, based on column positions of the cells, for both programming and sensing operations. As a result, if the voltage drop offset is to be ignored for design simplicity, the number of columns in each segment must be is limited to be small (~10). However, such designs may be suitable for common memory structures where the number of rows (e.g., 100s) is much greater than number of columns (e.g., 10s). Moreover, it is possible that read operations may introduce disturbance on the side columns in embodiment 1.

Embodiment 2—Trade-Off Between High Density and Low Leakage

Figure 16:
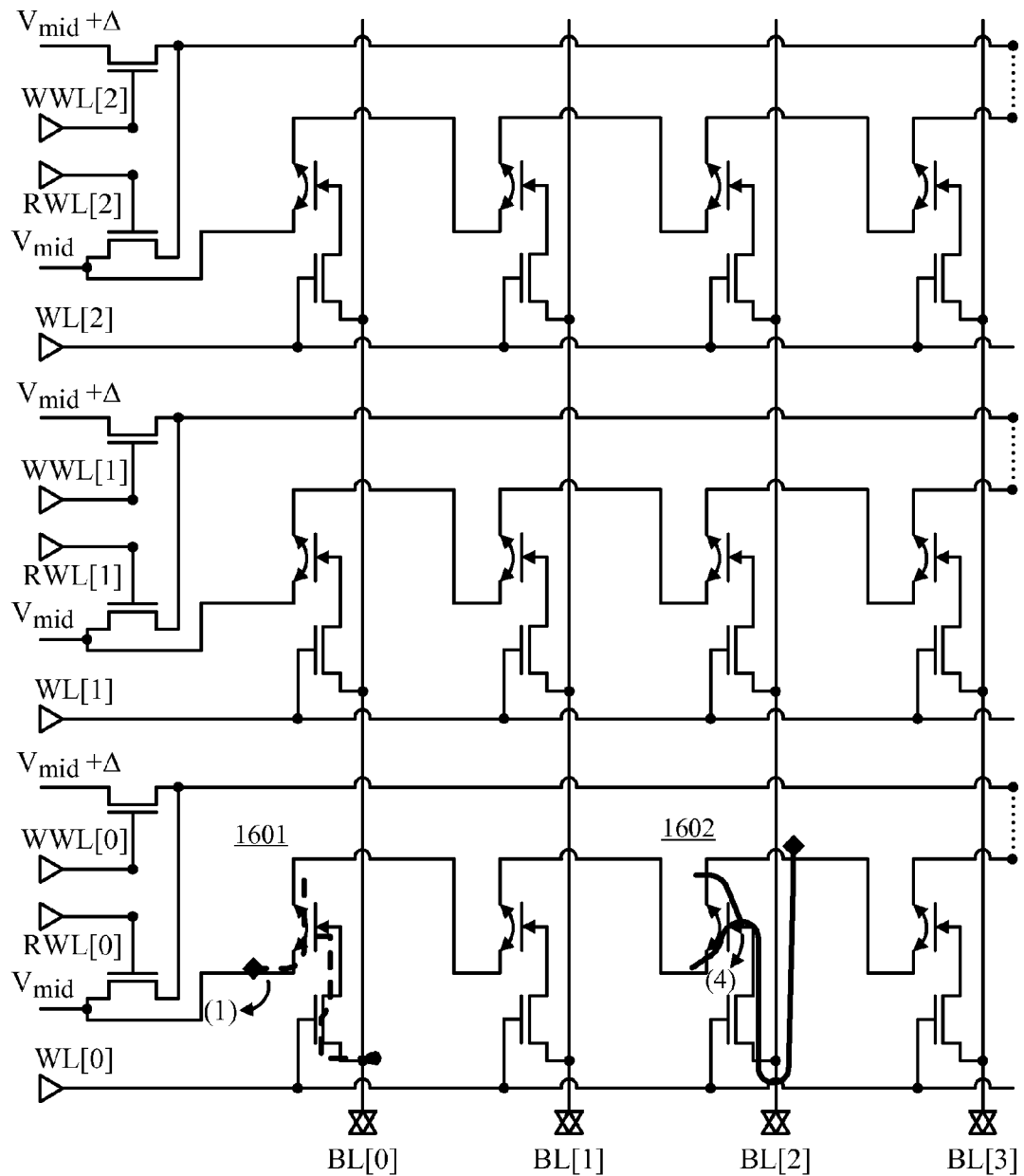
FIG. 16 illustrates a second exemplary embodiment of a memory array structure formed with a circuit topology comprising exemplary hybrid GSHE-STT-switched memory elements in 1T1J structures.

With reference to FIG. 16, a second exemplary embodiment of a memory array structure formed with a circuit topology comprising exemplary hybrid GSHE-STT memory elements is illustrated. Embodiment 2 relates to circuit topologies geared for trade-off between high density and low leakage, which include an exemplary hybrid GSHE-STT MTJs and an access transistor per bit cell. In this case, the read and write assistance paths (path between A and B) of the GSHE-STT MTJs of bit cells within a predetermined segment comprising a number of columns (e.g., 8) are connected in series and to two gating transistors connected to Vmid and Vmid+Δ as shown, and the gates of the two pass transistors are connected to RWL[0,1,2 . . . ] and WWL[0, 1, 2 . . . ] as shown, such that Vmid is connected to the first write terminal A (or B) of GSHE-STT MTJ in the first GSHE-STT MTJ (e.g., 1601) of a row, whereas Vmid and Vmid+Δ are connected via the two gating transistors to the second write terminal B (or A) of the GSHE-STT MTJ in the last GSHE-STT cell in series. Each GSHE-STT MTJ is connected to a drain (or source) of an access transistor, where the gate of the access transistor is connected to the word lines WL[0, 1, 2 . . . ], and whose source (or drain) is connected to bit lines BL[0, 1, 2, . . . ]. An intended write path for cell 1601 is shown as "(1)," and an intended read path for cell 1602 is shown as "(4)." Once again, unlike conventional implementations 1-6, there are no unintended read or write paths herein.

Advantageous aspects of the exemplary embodiment 2 include lowered leakage due to the gating from the added transistors in comparison to embodiment 1, in addition to improved amenability of programming current and voltage, for controlling the read/write with access transistors sized to the smallest/minimum possible sizes. The illustrated structures share WL[0]-[2] across multiple columns in order to improve density. Accordingly, the structures may be divided into segments comprising small numbers of columns, e.g. for 8 columns. In an example, for the case of a write operation, when passing the write assistance current $I_W$=15 uA, the offset voltage across the overall write assistance path is given by $V_{offset}$=15 uA*1KΩ*8=120 mV, which is acceptable for when Δ>120 mV is used; and for the case of a read operation with read current on each bit line $I_R$=5 uA, the offset voltage across the overall read assistance path is $V_{offset}$=(4+3+2+1)*5 uA*1KΩ=50 mV, which corresponds to signal voltage of $V_{signal}$=5 uA*25KΩ=125 mV. This gives rise to a large signal to noise/interference ratio $V_{signal}/V_{offset}$=3. Another advantageous aspect relates to a small layout, which can be made much more compact for series connections.

However, it is possible that embodiment 2 may also require special consideration of voltage drop offsets along the series connection line of memory cells, connected to a particular word line, based on column positions of the cells, for both programming and sensing operations. As a result, if the voltage drop offset is to be ignored for design simplicity, the number of columns in each segment must be is limited to be small (~10). However, such designs may be suitable for common memory structures where the number of rows (e.g., 100s) is much greater than number of columns (e.g., 10s). Moreover, it is possible that read operations may introduce disturbance on the side columns in embodiment 2.

Embodiment 3—Low Leakage

Figure 17:
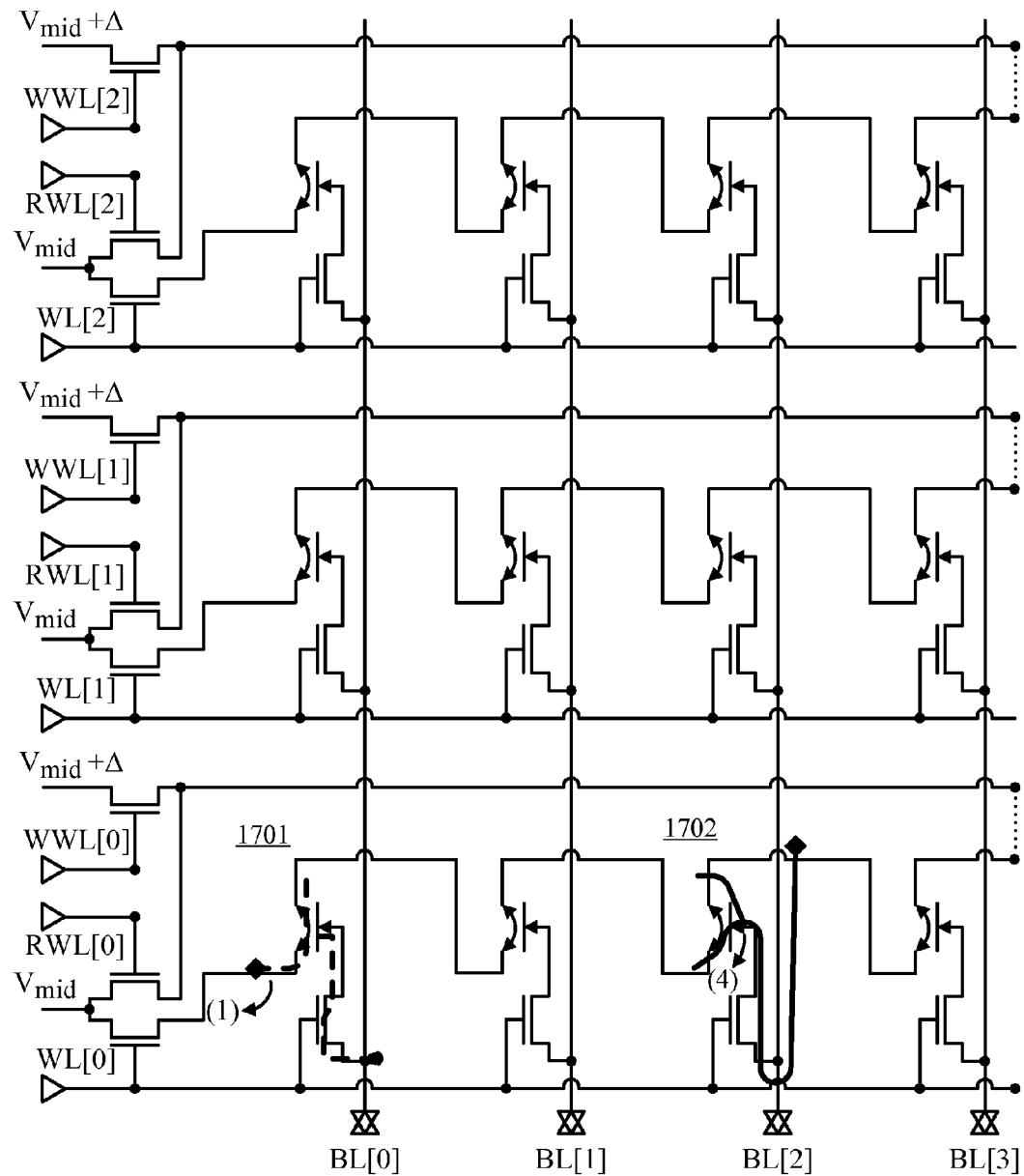
FIG. 17 illustrates a third exemplary embodiment of a memory array structure formed with a circuit topology comprising exemplary hybrid GSHE-STT-switched memory elements in 1T1J structures.

With reference to FIG. 17, a third exemplary embodiment of a memory array structure formed with a circuit topology comprising exemplary hybrid GSHE-STT memory elements, is illustrated. Embodiment 3 relates to circuit topologies geared for low leakage, which include an exemplary hybrid GSHE-STT MTJ and an access transistor per bit cell. In this case, the read and write assistance paths (path between A and B) of the GSHE-STT MTJs of bit cells within a predetermined segment comprising a number of columns (e.g., 8) are connected in series and to three gating transistors connected to Vmid and Vmid+Δ as shown. The gates of two gating transistors which are connected to Vmid are connected to RWL[0,1,2 . . . ] and WL[0, 1, 2 . . . ], and the gate of the gating transistor connected to Vmid+Δ is connected to WWL[0, 1, 2 . . . ] as shown. One remaining terminal of one of the gating transistors whose gate is connected to WL[0, 1, 2 . . . ] is connected to the first write terminal A (or B) of the first GSHE-STT MTJ (e.g., 1701) of a row, whereas the remaining terminals of the other two gating transistors are connected to the second write terminal B (or A) of the last GSHE-STT MTJ in the series connection. Each GSHE-STT MTJ is connected to a drain (or source) of an access transistor, where the gate of the access transistor is connected to the word lines WL [0, 1, 2 . . . ], and whose source (or drain) is connected to bit lines BL[0, 1, 2, . . . ]. An intended write path for cell 1701 is shown as "(1)," and an intended read path for cell 1702 is shown as "(4)." Once again, unlike conventional implementations 1-6, there are no unintended read or write paths herein.

Advantageous aspects of the exemplary embodiment 3 include even lower leakage due to the gating from the added transistors in comparison to embodiment 2, in addition to improved amenability of programming current and voltage, for controlling the read/write with access transistors sized to the smallest/minimum possible sizes. The illustrated structures share WL[0]-[2] across multiple columns in order to improve density. Accordingly, the structures may be divided into segments comprising small numbers of columns, e.g. for 8 columns. In an example, for the case of a write operation, when passing the write assistance current $I_W$=15 uA, the offset voltage across the overall write assistance path is given by $V_{offset}$=15 uA*1KΩ*8=120 mV, which is acceptable for when Δ>120 mV is used; and for the case of a read operation with read current on each bit line $I_R$=5 uA, the offset voltage across the overall read assistance path is $V_{offset}$=(4+3+2+1)*5 uA*1KΩ=50 mV, which corresponds to signal voltage of $V_{signal}$=5 uA*25KΩ=125 mV. This gives rise to a large signal to noise/interference ratio $V_{signal}/V_{offset}$=3. Another advantageous aspect relates to a small layout, which can be made much more compact for series connections.

However, it is possible that embodiment 3 may also require special consideration of voltage drop offsets along the series connection line of memory cells, connected to a particular word line, based on column positions of the cells, for both programming and sensing operations. As a result, if the voltage drop offset is to be ignored for design simplicity, the number of columns in each segment must be is limited to be small (~10). However, such designs may be suitable for common memory structures where the number of rows (e.g., 100s) is much greater than number of columns (e.g., 10s). Moreover, it is possible that read operations may introduce disturbance on the side columns in embodiment 3.

Embodiment 4—Improved Sensing Margin

Figure 18:
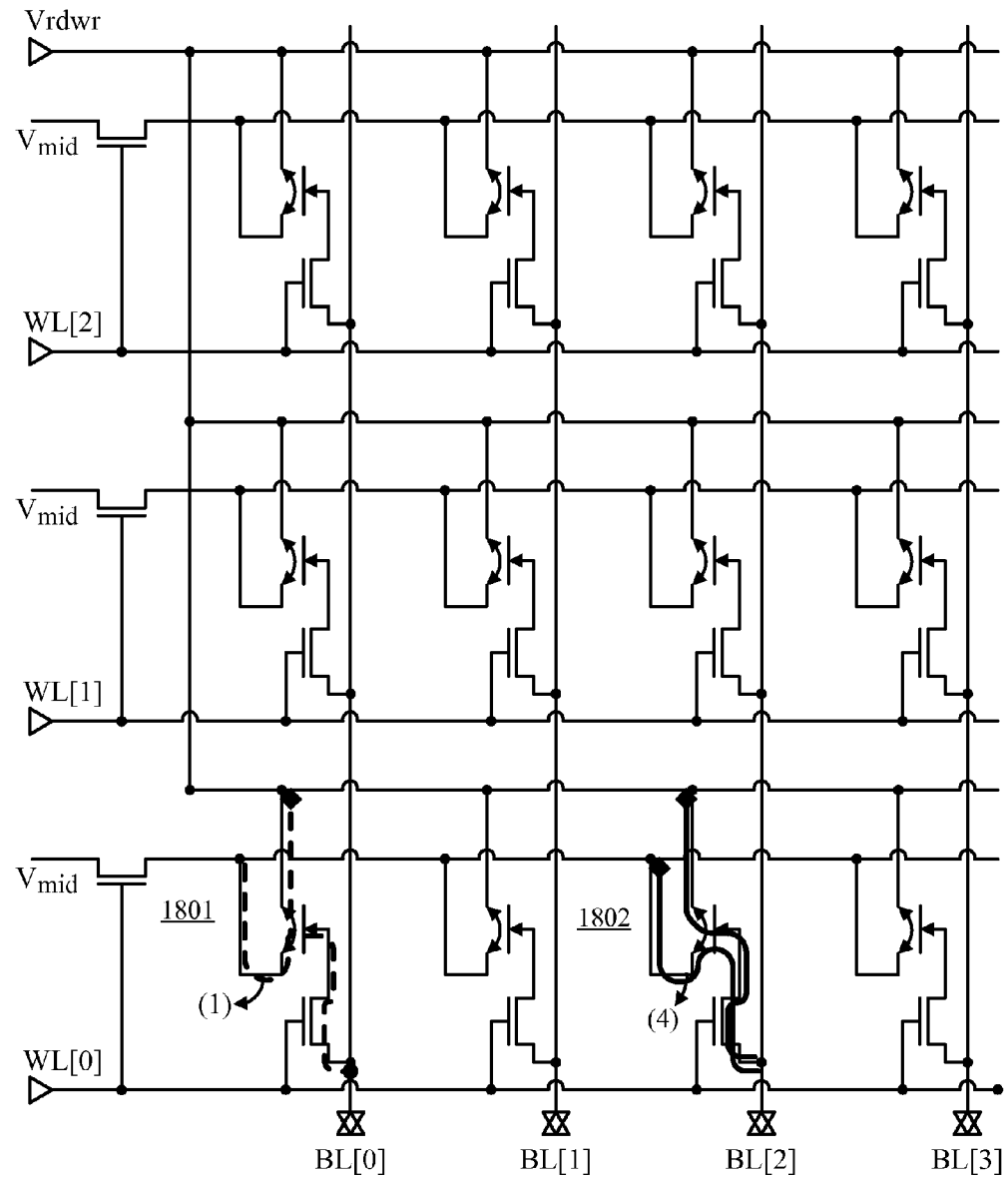
FIG. 18 illustrates a fourth exemplary embodiment of a memory array structure formed with a circuit topology comprising exemplary hybrid GSHE-STT-switched memory elements in 1T1J structures.

With reference to FIG. 18, a fourth exemplary embodiment of a memory array structure formed with a circuit topology comprising exemplary hybrid GSHE-STT memory elements, is illustrated. Embodiment 4 relates to circuit topologies geared for improved sensing margin, which include an exemplary hybrid GSHE-STT MTJ and an access transistor per bit cell. Unlike the previous three embodiments, the read and write assistance paths (path between A and B) of the GSHE-STT MTJs of bit cells are not connected in series within a segment; on the other hand, one terminal (e.g., A) of each GSHE-STT MTJ within a row is connected to Vmid through a gating transistor. Another terminal (e.g., B) of GSHE-STT MTJs of all bit cells within the memory array is connected to read/write voltage line Vrdwr. A third terminal (e.g., C) of each GSHE-STT MTJs is connected to a drain (or source) of an access transistor, where the gate of the access transistor is connected to the word lines WL[0, 1, 2 . . . ], and whose source (or drain) is connected to bit lines BL[0, 1, 2, . . . ]. An intended write path for cell 1801 is shown as "(1)," and an intended read path for cell 1802 is shown as "(4)." Unlike conventional implementations 1-6, there are no unintended read or write paths herein.

For a write operation on bit cell 1801, for example, in order to create the current paths shown in green (1), $V_{rdwr}$ is set to $V_{mid}$+Δ (where Δ can be positive or negative). The selected word line WL[i] is asserted for bit cell 1801 and all remaining, unselected word lines WL[*], are de-asserted. Appropriate current source (or equivalent voltage source) are set on BL[i] such that current flows into the terminal C of the GSHE-STT MTJ 1801 from BL[j] for writing logic 1, and out from the terminal C of the GSHE-STT MTJ 1801 to BL[i] for writing logic 0. The same process is performed for all columns Transistor gate overdrive is not requirement herein, as $V_d$ and $V_s$ of the access transistors are all operated near $V_{mid}$, so $V_{gd}$ will not become 0 or be close to 0, in order to create a need for gate overdrive.

For a read operation, on bit cell 1802, for example, to create current paths shown as "(4)" $V_{rdwr}$ is set to $V_{mid}$. The selected word line WL[i] is asserted for bit cell 1801 and all remaining, unselected word lines WL[*], are de-asserted. BL[i] is connected to a sensing circuit to sense the current flow (or equivalent) on BL[i] in comparison to a reference, where if the current flow is greater than the reference, then a logic 0 is read, and otherwise, a logic 1 is read. The same process is performed for all columns Once again, transistor gate overdrive is not needed as read is uni-polar, which ensures $V_{gd}$ is significantly great than 0.

An idle state is also defined, where $V_{rdwr}$ is floated, all BL[*] lines are floated, and word lines WL[*] are de-asserted by setting them to 0.

As seen from this embodiment, the four-terminal bit cells formed from the exemplary hybrid GSHE-STT structures offer improved sensing margin by removing the offset voltage across the same row, in addition to low leakage robust read, write, and idle operations without creating unintended paths or requiring overdrive voltages/transistor size increases (once again, the bit cells include one GSHE-STT MTJ which has three terminals and one access transistor which introduces one more terminal connected to the transistor gate, bringing the total to four terminals for the bit cells).

Embodiment 5—High Speed

Figure 19:
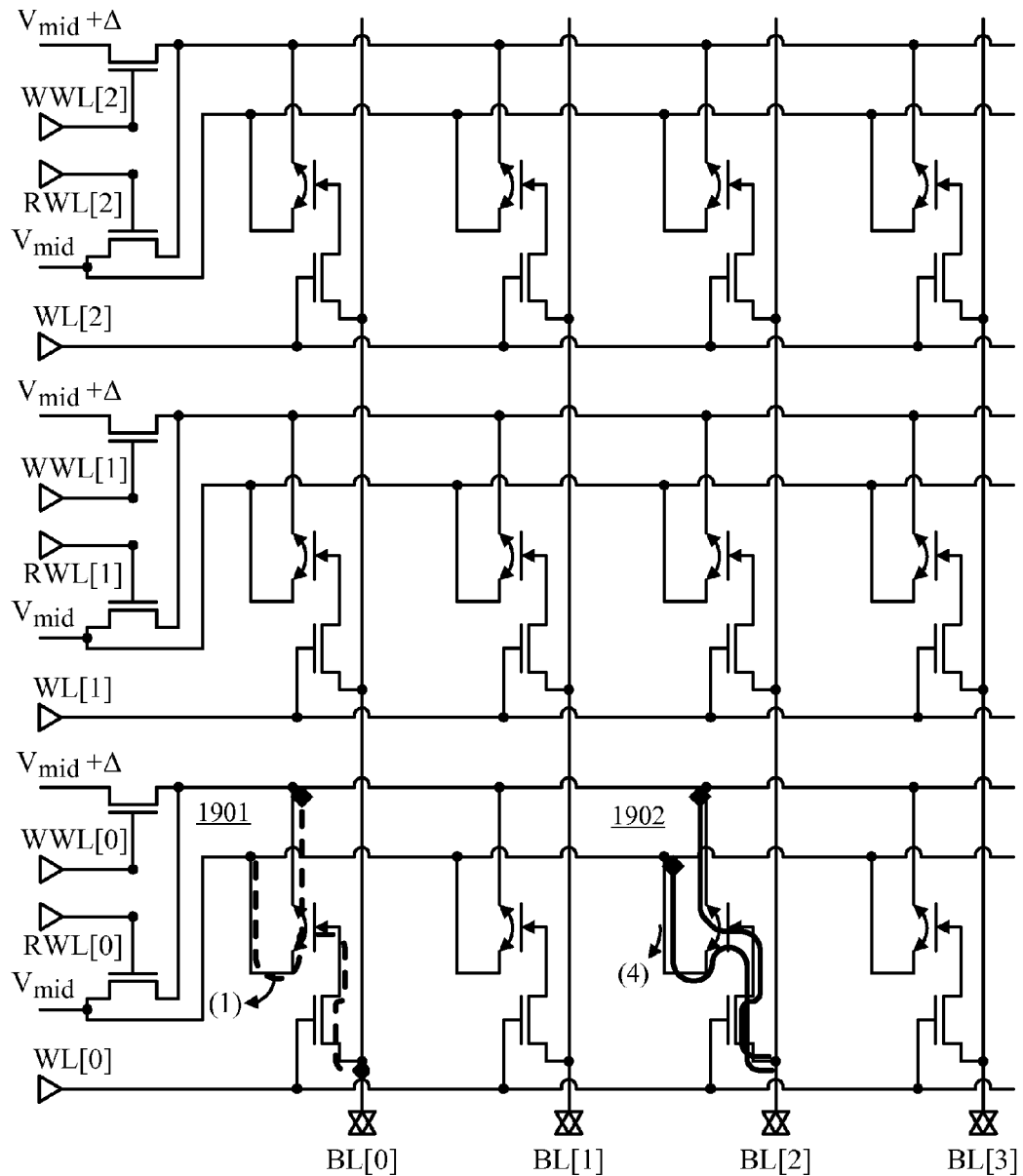
FIG. 19 illustrates a fifth exemplary embodiment of a memory array structure formed with a circuit topology comprising exemplary hybrid GSHE-STT-switched memory elements in 1T1J structures.

With reference to FIG. 19, a fifth exemplary embodiment of a memory array structure formed with a circuit topology comprising exemplary hybrid GSHE-STT memory elements, is illustrated. Embodiment 5 relates to circuit topologies geared for high speed operations by reducing the capacitive load for charging and discharging during read or write, which include an exemplary hybrid GSHE-STT MTJ and an access transistor per bit cell. Like embodiment 4, the read and write assistance paths (path between A and B) of the GSHE-STT MTJs of bit cells in the same row are not connected in series within a segment; on the other hand, one terminal (e.g., A) of each GSHE-STT MTJ within a row is connected to Vmid. Another terminal (e.g., B) of GSHE-STT MTJ within a row is connected to a voltage derived from two gating transistors, where one gating transistor is connected to Vmid, whose gate is connected to RWL[0, 1, 2 . . . ] and the other pass transistor is connected to Vmid+Δ, whose gate is connected to WWL[0, 1, 2, . . . ]. A third terminal (e.g., C) of each GSHE-STT MTJ in a bit cell is connected to a drain (or source) of an access transistor, where the gate of the access transistor is connected to the word lines WL[0, 1, 2 . . . ], and whose source (or drain) is connected to bit lines BL[0, 1, 2, . . . ]. An intended write path for cell 1901 is shown as "(1)," and an intended read path for cell 1902 is shown as "(4)." Unlike conventional implementations 1-6, there are no unintended read or write paths herein.

For a write operation on bit cell 1901, for example, in order to create the current paths shown in green (1), WL[i] and WWL[i] are asserted. Appropriate current source (or equivalent voltage source) are set on BL[i] such that current flows into the terminal C of the GSHE-STT MTJ 1901 from BL[j] for writing logic 1, and out from the terminal C of the GSHE-STT MTJ 1901 to BL[i] for writing logic 0. The same process is performed for all columns Transistor gate overdrive is not requirement herein, as $V_d$ and $V_s$ of the access transistors are all operated near $V_{mid}$, so $V_{gd}$ will not become 0 or be close to 0, in order to create a need for gate overdrive.

For a read operation, on bit cell 1902, for example, to create current paths shown in blue (4), WL[i] and RWL[i] are asserted. Unlike embodiment 4, embodiment 5 offers a simple solution where charging/discharging the entire memory array of bit cells based on voltage Vrdwr is avoided, which results in a faster operation. On the other hand, additional control lines WWL[ ] and RWL[ ] are required per row in addition to WL[ ], which also incurs one additional transistor per row.

Embodiment 6—Low Leakage and High Sensing Margin

Figure 20:
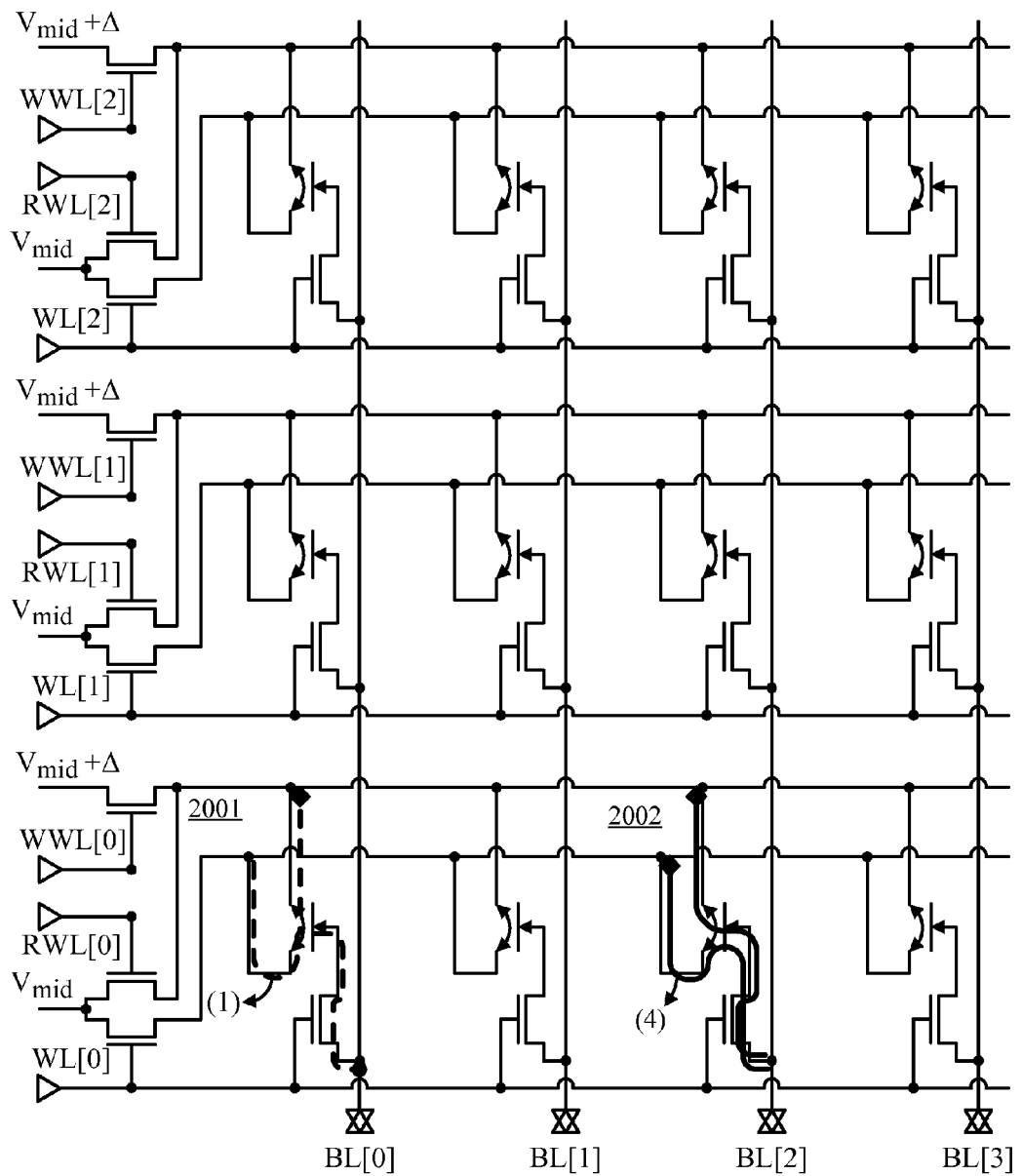
FIG. 20 illustrates a sixth exemplary embodiment of a memory array structure formed with a circuit topology comprising exemplary hybrid GSHE-STT-switched memory elements in 1T1J structures.

With reference to FIG. 20, a sixth exemplary embodiment of a memory array structure formed with a circuit topology comprising exemplary hybrid GSHE-STT memory elements, is illustrated. Embodiment 3 relates to circuit topologies geared for low leakage and high sensing margin by gating of Vmid and Vmid for ideal operations and further reduction of capacitive load seen by Vmid and Vmid+Δ during read/write operations, which include an exemplary hybrid GSHE-STT MTJ and an access transistor per bit cell. Like embodiments 4 and 5, the read and write assistance paths (path between A and B) of the GSHE-STT MTJs of bit cells are not connected in series within a segment; on the other hand, one terminal (e.g., A) of each GSHE-STT MTJ within a row is connected to Vmid through a first gating transistor whose gate is connected to WL[0, 1, 2, . . . ]. Another terminal (e.g., B) of GSHE-STT MTJs within a row is connected to a voltage derived from a second and a third gating transistor, where the second gating transistor is connected to Vmid, whose gate is connected to RWL[0, 1, 2 . . . ] and the third gating transistor is connected to Vmid+Δ, whose gate is connected to WWL[0, 1, 2, . . . ]. A third terminal (e.g., C) of each GSHE-STT MTJ is connected to a drain (or source) of an access transistor, where the gate of the access transistor is connected to the word lines WL[0, 1, 2 . . . ], and whose source (or drain) is connected to bit lines BL[0, 1, 2, . . . ]. An intended write path for cell 2001 is shown as "(1)," and an intended read path for cell 2002 is shown as "(4)." Unlike conventional implementations 1-6, there are no unintended read or write paths herein.

For a write operation on bit cell 2001, for example, in order to create the current paths shown as "(1)," WL[i] and WWL[i] are asserted. Appropriate current source (or equivalent voltage source) are set on BL[i] such that current flows into the terminal C of the GSHE-STT MTJ 2001 from BL[j] for writing logic 1, and out from the terminal C of the GSHE-STT MTJ 2001 to BL[i] for writing logic 0. The same process is performed for all columns Transistor gate overdrive is not requirement herein, as $V_d$ and $V_s$ of the access transistors are all operated near $V_{mid}$, so $V_{gd}$ will not become 0 or be close to 0, in order to create a need for gate overdrive.

For a read operation, on bit cell 2002, for example, to create current paths shown as "(4)," WL[i] and RWL[i] are asserted. In embodiment 6, leakage on the access transistors is further reduced by floating both drain and source of the access transistor if the corresponding memory cell is not selected for read or write. On the other hand, in comparison to embodiment 5, an additional gating transistor per row is incurred.

Accordingly, a description of exemplary embodiments related to memory comprising hybrid GSHE-STT MTJ memory cells, various circuit topologies and memory array structures related to the exemplary memory elements, along with advantageous aspects thereof, have been presented.

Figure 21:
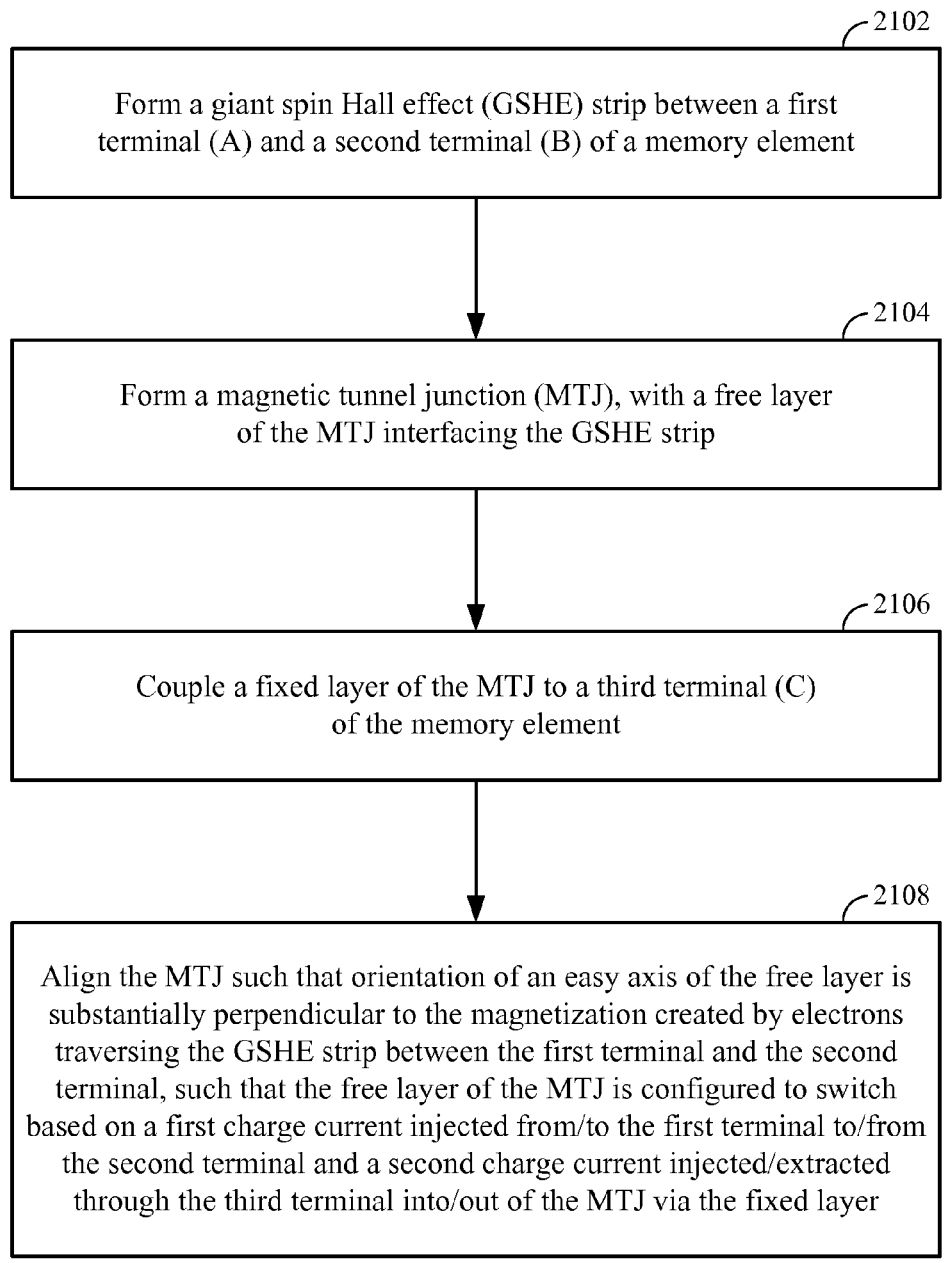
FIG. 21 illustrates a flow chart depiction of a method of forming exemplary hybrid GSHE-STT-switched memory elements in 1T1J structures according to aspects of this disclosure.

It will be appreciated that aspects include various methods for performing the processes, functions and/or algorithms disclosed herein. For example, as illustrated in FIG. 21, an aspect can include a method of forming a memory element, the method comprising: forming a giant spin Hall effect (GSHE) strip between a first terminal (A) and a second terminal (B) of the memory element—Block 2102; forming a magnetic tunnel junction (MTJ), with a free layer of the MTJ interfacing the GSHE strip—Block 2104; coupling a fixed layer of the MTJ to a third terminal (C) of the memory element—Block 2106; and aligning the MTJ such that the orientation of the easy axis of the free layer is substantially perpendicular to the magnetization created by electrons traversing the GSHE strip between the first terminal and the second terminal, such that the free layer of the MTJ is configured to switch based on a first charge current injected from/to the first terminal to/from the second terminal and a second charge current injected through the third terminal into/out of the MTJ through the fixed layer—Block 2108.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an exemplary embodiment can include a computer readable media embodying a method for forming exemplary hybrid GSHE-STT MRAM cells and related circuit topologies and memory arrays. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A memory array comprising:
    a first row comprising two or more bit cells;
    a first bit cell of the first row comprising a memory element with three terminals and an access transistor;
    a common gating transistor for the first row coupled to a first voltage, the common gating transistor to enable read and write operations for the first row, wherein the common gating transistor is coupled to a first terminal of the memory element;
    a bit line coupled to a drain/source terminal of the access transistor; and
    a word line for the first row coupled to a gate terminal of the access transistor;
    wherein a second terminal of the memory element is coupled to a second bit cell in the first row and a third terminal of the memory element is coupled to a source/drain terminal of the access transistor,
    wherein the memory element comprises a hybrid giant spin Hall effect (GSHE)-spin transfer torque (STT)-switched magnetic tunnel junction (MTJ).

2. The memory array of claim 1, wherein the hybrid GSHE-STT-MTJ comprises:
    a GSHE strip formed between the first terminal and the second terminal; and
    a MTJ, with a free layer of the MTJ interfacing the GSHE strip and a fixed layer of the MTJ coupled to the third terminal;
    wherein an orientation of an easy axis of the free layer is substantially perpendicular to the magnetization created by electrons traversing the GSHE strip between the first terminal and the second terminal,
    such that the free layer of the MTJ is configured to switch based on a first charge current injected from/to the first terminal to/from the second terminal and a second charge current injected/extracted through the third terminal into/out of the MTJ via the fixed layer.

3. The memory array of claim 1, wherein the second terminal of the first bit cell is coupled to a read-write voltage through the second bit cell and the common gating transistor is gated by the word line.

4. The memory array of claim 3, wherein the first voltage is approximately half of a positive supply voltage, such that the read-write voltage is set to approximately the first voltage for a read operation on the first bit cell and the read-write voltage is set to be delta greater than the first voltage for a write operation on the first bit cell.

5. The memory array of claim 1, wherein the first voltage is coupled to the first terminal of the memory element through the common gating transistor and a second gating transistor.

6. The memory array of claim 5, wherein the second gating transistor is connected to a read word line for the first row, the read word line used for a read operation on the first bit cell.

7. The memory array of claim 5, wherein the second terminal of the first bit cell is coupled to the common gating transistor through the second bit cell, and wherein the common gating transistor is connected to a write word line for the first row, the write word line used for a write operation on the first bit cell.

8. The memory array of claim 5, wherein a gate of the second gating transistor is enabled by a read word line and the word line for the first row for a read operation on the first bit cell.

9. The memory array of claim 1, wherein the second terminal of the first bit cell is coupled to a read-write voltage through the second terminal of the memory element, wherein the read-write voltage is coupled to the two or more bit cells of the first row and to bit cells of two or more rows of the memory array.

10. The memory array of claim 9, wherein the common gating transistor is gated by the word line.

11. The memory array of claim 1, wherein the first voltage is coupled to the first terminal of the memory element through the common gating transistor and a second gating transistor, and wherein the second terminal of the first bit cell is coupled to the common gating transistor.

12. The memory array of claim 11, wherein the common gating transistor is enabled by a write word line for the first row for a write operation on the first bit cell.

13. The memory array of claim 11, wherein the second gating transistor is enabled by a read word line for the first row for a read operation on the first bit cell.

14. The memory array of claim 1, wherein the first voltage is coupled to the first terminal of the memory element through the common gating transistor, a second gating transistor, and a third gating transistor.

15. The memory array of claim 14, wherein the second terminal of the first bit cell is coupled to the common gating transistor, and wherein the common gating transistor is enabled by a write word line for the first row for a write operation on the first bit cell.

16. The memory array of claim 14, wherein the second gating transistor is enabled by a read word line for the first row and the third gating transistor is enabled by the word line for a read operation on the first bit cell.

17. A method of configuring a memory array, the method comprising:
   forming a first row of the memory array with two or more bit cells;
   forming a first bit cell of the first row with a memory element comprising three terminals and an access transistor;
   coupling a common gating transistor for the first row to a first voltage, the common gating transistor for enabling read and write operations for the first row, and coupling the common gating transistor to a first terminal of the memory element;
   coupling a bit line to a drain/source terminal of the access transistor;
   coupling a word line for the first row to a gate terminal of the access transistor;
   coupling a second terminal of the memory element to a second bit cell in the first row; and
   coupling a third terminal of the memory element to a source/drain terminal of the access transistor,
   wherein the memory element comprises a hybrid giant spin Hall effect (GSHE)-spin transfer torque (STT)-switched magnetic tunnel junction (MTJ).

18. The method of claim 17, wherein forming the memory element comprises:
   forming a GSHE strip between the first terminal and the second terminal; and
   forming a MTJ, with a free layer of the MTJ interfacing the GSHE strip and coupling a fixed layer of the MTJ to the third terminal;
   wherein an orientation of an easy axis of the free layer is substantially perpendicular to the magnetization created by electrons traversing the GSHE strip between the first terminal and the second terminal,
   wherein the free layer of the MTJ is caused to switch based on a first charge current injected from/to the first terminal to/from the second terminal and a second charge current injected/extracted through the third terminal into/out of the MTJ via the fixed layer.

19. The method of claim 17, comprising coupling the second terminal of the first bit cell to a read-write voltage through the second bit cell and gating the common gating transistor by the word line.

20. The method of claim 17, comprising coupling the first voltage to the first terminal of the memory element through the common gating transistor and a second gating transistor.

21. The method of claim 17, comprising coupling the second terminal of the first bit cell to a read-write voltage through the second terminal of the memory element and coupling the read-write voltage to the two or more bit cells of the first row and to bit cells of two or more rows of the memory array.

22. The method of claim 17, comprising coupling the first voltage to the first terminal of the memory element through the common gating transistor and a second gating transistor, and coupling the second terminal of the first bit cell to the common gating transistor.

23. The method of claim 17, comprising coupling the first voltage to the first terminal of the memory element through the common gating transistor, a second gating transistor, and a third gating transistor.

24. The method of claim 17, comprising coupling the second terminal of the first bit cell to the common gating transistor, and enabling the common gating transistor by a write word line for the first row, for a write operation on the first bit cell.

25. A memory array comprising:
   a first row with two or more bit cells;
   a first bit cell of the first row comprising a memory element with three terminals and an access transistor; and
   common gating means for the first row coupled to a first voltage, the common gating means comprising means for enabling read and write operations for the first row, the common gating means coupled to a first terminal of the memory element;
   wherein the memory element comprises a hybrid giant spin Hall effect (GSHE)-spin transfer torque (STT)-switched magnetic tunnel junction (MTJ).

* * * * *